United States Patent
Lee et al.

(10) Patent No.: US 11,653,110 B2
(45) Date of Patent: May 16, 2023

(54) IMAGE SENSOR

(71) Applicant: SAMSUNG ELECTRONICS CO., LTD., Suwon-si (KR)

(72) Inventors: Jaekyu Lee, Seongnam-si (KR); Heesung Shim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/476,220

(22) Filed: Sep. 15, 2021

(65) Prior Publication Data
US 2022/0094864 A1    Mar. 24, 2022

(30) Foreign Application Priority Data

Sep. 18, 2020 (KR) .......................... 10-2020-0120524
Apr. 8, 2021 (KR) .......................... 10-2021-0046094

(51) Int. Cl.
| H04N 5/353 | (2011.01) |
| H04N 5/378 | (2011.01) |
| H04N 5/374 | (2011.01) |
| H01L 27/146 | (2006.01) |
| H04N 5/369 | (2011.01) |
| H04N 5/376 | (2011.01) |

(52) U.S. Cl.
CPC ..... *H04N 5/3532* (2013.01); *H01L 27/14612* (2013.01); *H01L 27/14643* (2013.01); *H04N 5/378* (2013.01)

(58) Field of Classification Search
CPC ...... H04N 5/3532; H04N 5/378; H04N 5/374; H04N 5/3535; H01L 27/14643; H01L 27/14612
See application file for complete search history.

(56) References Cited

U.S. PATENT DOCUMENTS

| 8,153,947 B2 | 4/2012 | Barbier et al. |
| 8,569,671 B2 | 10/2013 | Meynants et al. |
| 9,100,605 B2 | 8/2015 | Raynor |
| 9,224,771 B2 | 12/2015 | Yamashita et al. |
| 9,257,468 B2 | 2/2016 | Gomi et al. |

(Continued)

FOREIGN PATENT DOCUMENTS

| JP | 4846076 B1 | 12/2011 |
| JP | 2017-103696 A | 6/2017 |
| JP | WO2018/207731 A1 | 11/2018 |

*Primary Examiner* — Marly S Camargo
(74) *Attorney, Agent, or Firm* — Sughrue Mion, PLLC

(57) ABSTRACT

An image sensor is disclosed. The image sensor includes a plurality of pixels arranged in a plurality of rows and a plurality of columns, each of the pixels including: a photodiode; a floating diffusion node configured to accumulate photocharges generated from the photodiode; a first capacitor configured to store charges according to a voltage of the floating diffusion node which is reset; a second capacitor configured to store charges according to a voltage of the floating diffusion node in which the photocharges are accumulated; a first sampling transistor connected to a first output node and configured to sample charges to the first capacitor; a second sampling transistor connected to the first output node and configured to sample charges to the second capacitor; and at least one precharge select transistor connected to the first output node and configured to reset the first output node.

20 Claims, 18 Drawing Sheets

(56) References Cited

U.S. PATENT DOCUMENTS

| | | | |
|---|---|---|---|
| 9,654,712 B2 | 5/2017 | Hong | |
| 9,756,271 B2* | 9/2017 | Luo | H04N 5/37452 |
| 9,807,330 B2 | 10/2017 | Aoki | |
| 10,110,840 B2 | 10/2018 | Velichko | |
| 10,403,672 B2 | 9/2019 | Hanzawa | |
| 10,531,034 B2 | 1/2020 | Rotte et al. | |
| 11,094,726 B2 | 8/2021 | Simony | |
| 11,206,367 B1* | 12/2021 | Shim | H04N 5/378 |
| 11,375,145 B2* | 6/2022 | Otaka | H04N 5/374 |
| 11,509,851 B2* | 11/2022 | Shim | H04N 5/378 |
| 2007/0007434 A1* | 1/2007 | Pain | H04N 5/35527 |
| | | | 250/208.1 |
| 2008/0291305 A1 | 11/2008 | Kasuga et al. | |
| 2009/0200454 A1* | 8/2009 | Barbier | H01L 31/00 |
| | | | 250/214.1 |
| 2010/0079632 A1* | 4/2010 | Walschap | H04N 5/37452 |
| | | | 348/294 |
| 2014/0008520 A1* | 1/2014 | Raynor | H01L 27/14613 |
| | | | 250/208.1 |
| 2016/0088251 A1* | 3/2016 | Luo | H04N 5/37452 |
| 2016/0099268 A1 | 4/2016 | Minowa | |
| 2016/0173797 A1 | 6/2016 | Minowa | |
| 2018/0295303 A1 | 10/2018 | Murao | |
| 2020/0700400 * | 3/2020 | Shim | H04N 5/378 |
| 2020/0312896 A1* | 10/2020 | Simony | H01L 27/14612 |
| 2021/0144330 A1* | 5/2021 | Otaka | H04N 5/3698 |
| 2022/0191418 A1* | 6/2022 | Jung | H04N 5/378 |
| 2022/0394197 A1* | 12/2022 | Jung | H04N 5/3559 |

* cited by examiner

IMAGE SENSOR

CROSS-REFERENCE TO RELATED APPLICATIONS

This application is based on and claims priority under 35 U.S.C. § 119 to Korean Patent Application Nos. 10-2020-0120524, filed on Sep. 18, 2020, and 10-2021-0046094, filed on Apr. 8, 2021, in the Korean Intellectual Property Office, the disclosures of which are incorporated by reference herein in their entirety.

BACKGROUND

Example embodiments of the inventive concept relate to an image sensor, and more particularly, to an image sensor capable of supporting driving in a global shutter mode.

An image sensor for capturing an image and converting the image into an electrical signal is used not only for general consumer electronic devices such as digital cameras, portable phone cameras, and portable camcorders but also for cameras mounted in vehicles, security devices, and robots, not being limited thereto.

The image sensor may adjust an exposure time to control an amount of photocharges on which an electrical signal is based. The image sensor may adjust the exposure time by using a rolling shutter mode or a global shutter mode. In the rolling shutter mode, a photocharge integration time for each row of a pixel array is differently controlled, and, in the global shutter mode, the photocharge integration time is controlled to be the same for different rows of the pixel array.

SUMMARY

The inventive concept provides an image sensor for generating a distortion-free image by controlling a photocharge integration time of pixels.

According to an embodiment, there is provided an image sensor including a pixels arranged in a rows and a columns, each of the pixels including: a photodiode; a floating diffusion node configured to accumulate photocharges generated by the photodiode; a first capacitor configured to store charges according to a voltage of the floating diffusion node which is reset; a second capacitor configured to store charges according to a voltage of the floating diffusion node in which the photocharges are accumulated; a first sampling transistor connected to a first output node and configured to sample charges to the first capacitor; a second sampling transistor connected to the first output node and configured to sample charges to the second capacitor; and at least one precharge select transistor connected to the first output node and configured to reset the first output node.

According to another embodiment, there is provided an image sensor including a pixel array in which a pixels are arranged, each of the pixels including: a photodiode; a floating diffusion node configured to accumulate photocharges generated by the photodiode; a first source follower configured to amplify a voltage of the floating diffusion node and output the amplified voltage; at least one precharge select transistor connected in series to the first source follower; a precharge transistor connected in series to the first source follower and configured to precharge a first output node; a first capacitor configured to store charges according to a voltage of the floating diffusion node which is reset; a second capacitor configured to store charges according to a voltage of the floating diffusion node in which the photocharges are accumulated; a first sampling transistor configured to sample charges to the first capacitor; a second sampling transistor configured to sample charges to the second capacitor; and a second source follower configured to output, to a column line, a pixel signal according to a potential change of the first output node connected to the first sampling transistor and the second sampling transistor.

According to another embodiment of the inventive concept, there is provided an image sensor including a first pixel and a second pixel, each of the first pixel and the second pixel including: a photodiode; a floating diffusion node configured to accumulate photocharges generated by the photodiode; a first source follower configured to amplify a voltage of the floating diffusion node and output the amplified voltage; a precharge transistor configured to precharge an output node; first and second precharge select transistors configured to reset the output node; a first capacitor connected to the output node and configured to store charges according to a voltage of the floating diffusion node which is reset; a second capacitor connected to the output node and configured to store charges according to a voltage of the floating diffusion node in which the photocharges are accumulated; and a second source follower configured to output, to a column line, a pixel signal according to a potential change of the output node, wherein the first pixel and the second pixel share the second precharge select transistor and the second source follower.

BRIEF DESCRIPTION OF DRAWINGS

Embodiments of the inventive concept will be more clearly understood from the following detailed description taken in conjunction with the accompanying drawings in which.

DETAILED DESCRIPTION OF EMBODIMENTS

Hereinafter, embodiments of the inventive concept will be described in detail with reference to the accompanying drawings. The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Figure 1:
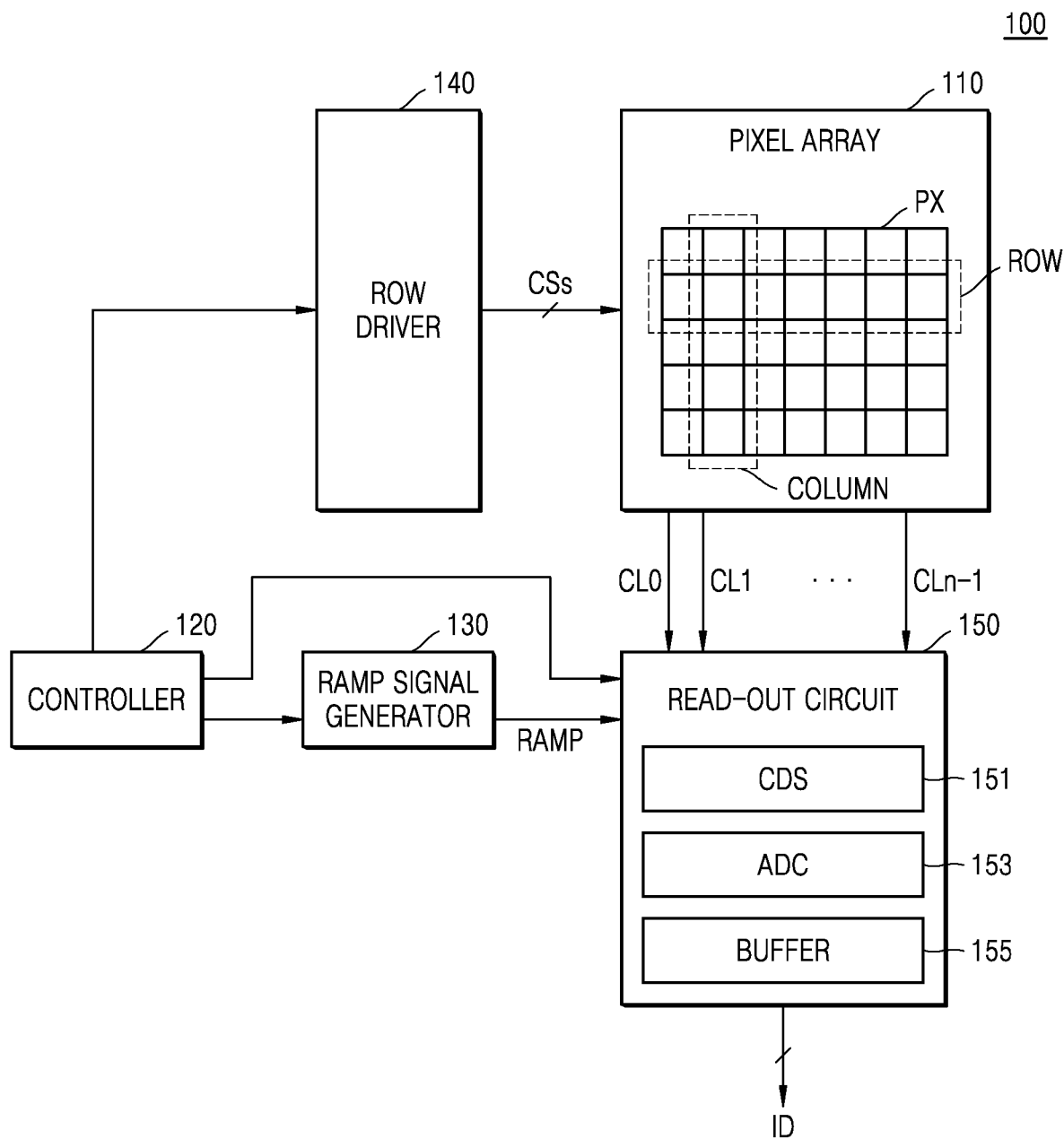
FIG. 1 is a block diagram of an image sensor according to an embodiment.

FIG. 1 is a block diagram of an image sensor according to an embodiment.

An image processing system may include an image sensor 100 shown in FIG. 1 and a digital signal processor (DSP) (not shown). The image sensor 100 and the DSP may be implemented as individual chips or implemented as a single image sensor chip. The DSP may process a signal based on image data. For example, the DSP may perform noise reduction processing, gain control, waveform shaping processing, interpolation processing, white balance processing, gamma processing, edge enhancement processing, and the like.

Referring to FIG. 1, the image sensor 100 may include a pixel array 110, a controller 120, a ramp signal generator 130, a row driver 140, and a read-out circuit 150. For example, the read-out circuit 150 may include a correlated-double sampling (CDS) circuit 151, an analog-digital converter (ADC) 153, a buffer 155, and the like.

The pixel array 110 may include a plurality of pixels PX. Each of the pixels PX may include a photoelectric conversion element, and generate a pixel signal corresponding to an object by converting sensed light into an electrical signal by the photoelectric conversion element. The pixels PX may respectively output pixel signals to the read-out circuit 150 through corresponding first to $n^{th}$ column lines CL0 to CLn−1.

In the pixel array 110, the pixels PX may be arranged in a matrix form in a plurality of rows and a plurality of columns. The pixels PX may be an active pixel sensor (APS).

According to an embodiment, each of the pixels PX may include one of a red filter transmitting therethrough light in a red wavelength region, a green filter transmitting therethrough light in a green wavelength region, and a blue filter transmitting therethrough light in a blue wavelength region. However, the present embodiment is not limited thereto, and each of the pixels PX may include a color filter transmitting therethrough light in a wavelength region of color different from red, green and blue or a transparent filter. According to an embodiment, each of the pixels PX may include one of a white filter, a cyan filter, a magenta filter, and a yellow filter.

The controller 120 may control an operation of the row driver 140, an operation of the ramp signal generator 130, and an operation of the read-out circuit 150. The controller 120 may include a control register block, and the control register block may control operations of the row driver 140, the ramp signal generator 130, and the read-out circuit 150 under control of the DSP. According to an embodiment, the controller 120 may control the row driver 140, the ramp signal generator 130, and the read-out circuit 150 so that the image sensor 100 operates in a global shutter mode.

The row driver 140 may generate control signals CSs for controlling the pixel array 110, and provide the control signals CSs to each of the pixels PX. According to an embodiment, the row driver 140 may determine activation and inactivation timings of the control signals CSs to each of the pixels PX to operate in the global shutter mode.

The control signals CSs may be generated to correspond to each row of the pixel array 110 so that the pixel array 110 is controlled by row. The pixel array 110 may output a reset signal and an image signal from selected one or more rows to the read-out circuit 150 in response to the control signals CSs provided from the row driver 140.

The ramp signal generator 130 may generate a ramp signal RAMP. The ramp signal RAMP is a signal for converting an analog signal into a digital signal, and may be generated to have a triangle wave form. The ramp signal generator 130 may provide the ramp signal RAMP to the read-out circuit 150, e.g., the CDS circuit 151.

The CDS circuit 151 may sample and hold a pixel signal provided from the pixel array 110. The CDS circuit 151 may output a level of particular noise, i.e., sample both the reset signal and the image signal, and output a level corresponding to a difference between the sampled signals. In addition, the CDS circuit 151 may receive the ramp signal RAMP generated by the ramp signal generator 130, compare the ramp signal RAMP and the pixel signal, and output a comparison result. The ADC 153 may convert an analog signal corresponding to the level received from the CDS circuit 151 into a digital signal. The buffer 155 may latch the digital signal and sequentially output latched image data ID.

Figure 2:
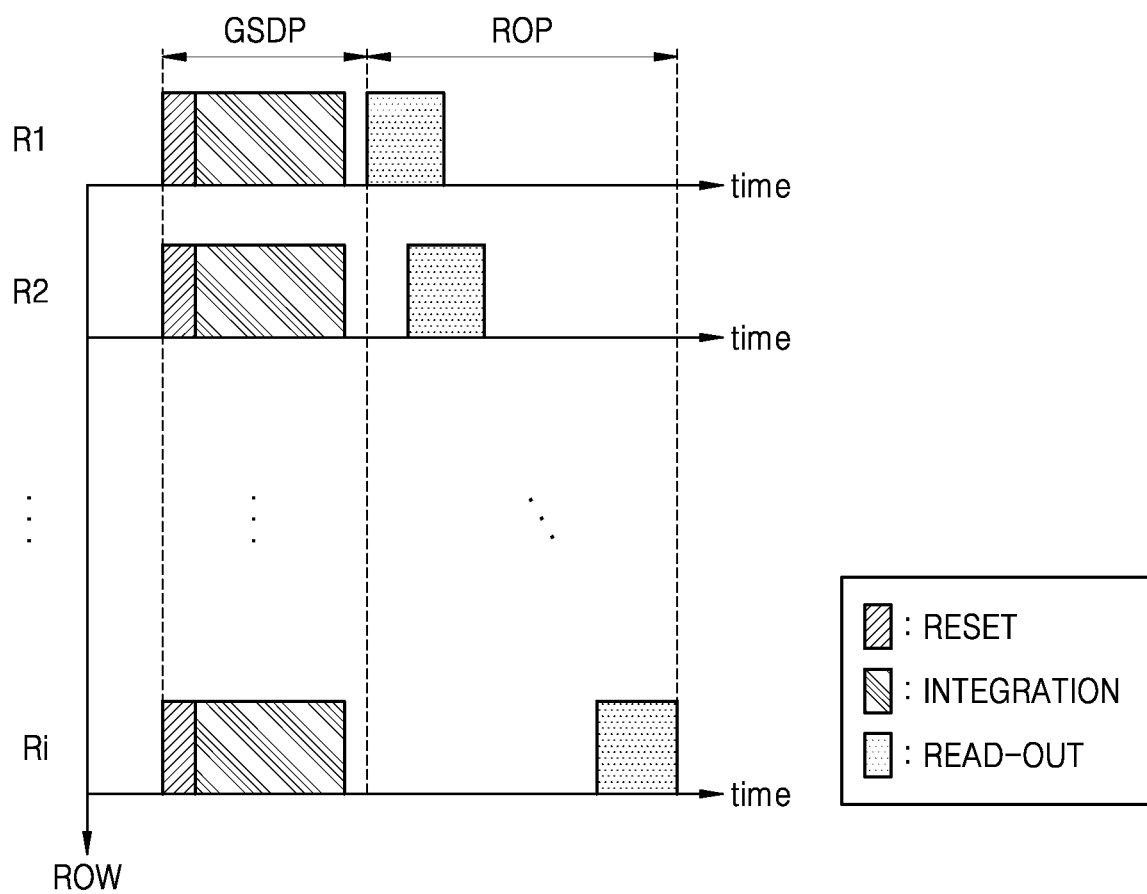
FIG. 2 illustrates an operation of an image sensor in a global shutter mode, according to an embodiment.

FIG. 2 illustrates an operation of an image sensor in the global shutter mode, according to an embodiment.

Referring to FIGS. 1 and 2, the image sensor 100 may operate in the global shutter mode. In the global shutter mode, the image sensor 100 may perform a global signal dumping operation during a global signal dumping period GSDP and perform a read-out operation during a read-out period ROP. The global signal dumping operation may include a reset operation of resetting charges accumulated in a floating diffusion node and an accumulation operation of accumulating, for an integration time, photocharges generated by a photoelectric conversion element.

In the global signal dumping period GSDP, the image sensor 100 may operate such that the reset operation and the accumulation operation for different rows, e.g., first to $i^{th}$ rows R1 to Ri (i is a natural number of 2 or more) of the pixel array 110 are performed at the same time, as shown in FIG. 2. The integration time for which the accumulation operation is performed may indicate a time for which photocharges generated by a photoelectric conversion element, e.g., a photodiode, included in each of the pixels PX are substantially accumulated.

In the read-out period ROP, a rolling read-out operation of sequentially performing the read-out operation for each row may be performed. The image sensor 100 may operate such that the read-out operation is sequentially performed during a read-out time from the first row R1 to the $i^{th}$ row Ri. The read-out time may indicate a time for which a pixel signal corresponding to photocharges generated by each of the pixels PX is output from each of the pixels PX.

The image sensor 100 according to the embodiment may operate in the global shutter mode to control photocharge integration time points of pixels PX, arranged in different rows, to be identical, and remove image distortion due to a difference in photocharge integration time period. However, the image sensor 100 according to the embodiment may operate in a rolling shutter mode by switching an operation mode. When the image sensor 100 operates in the rolling shutter mode, the image sensor 100 may control a photocharge integration time point of a photodiode to be different for each row of the pixel array 110. According to embodiments, the integration time points may be the same for all rows or the same for rows in a certain group. The operation mode of the image sensor 100 may be set by the DSP.

Figure 3:
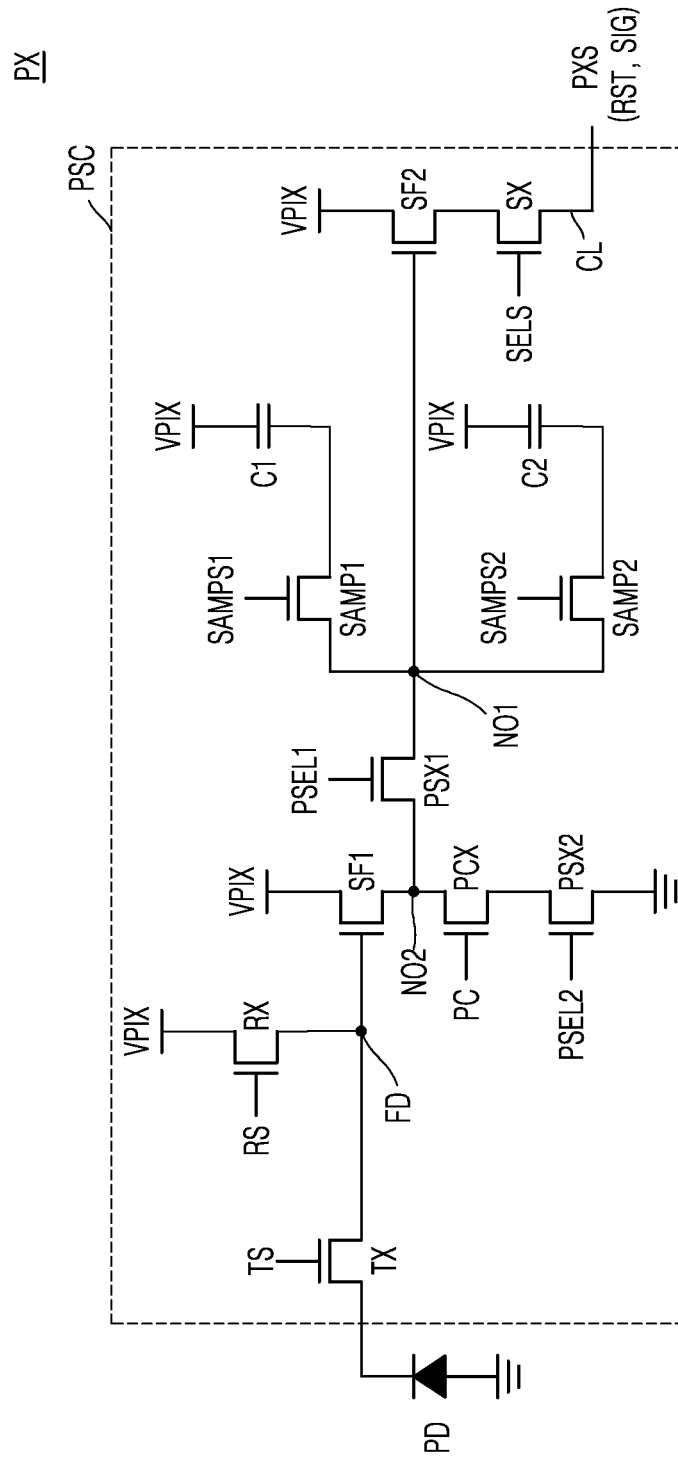
FIGS. 3 to 7 are circuit diagrams of pixels included in an image sensor, according to embodiments.
Figure 4:
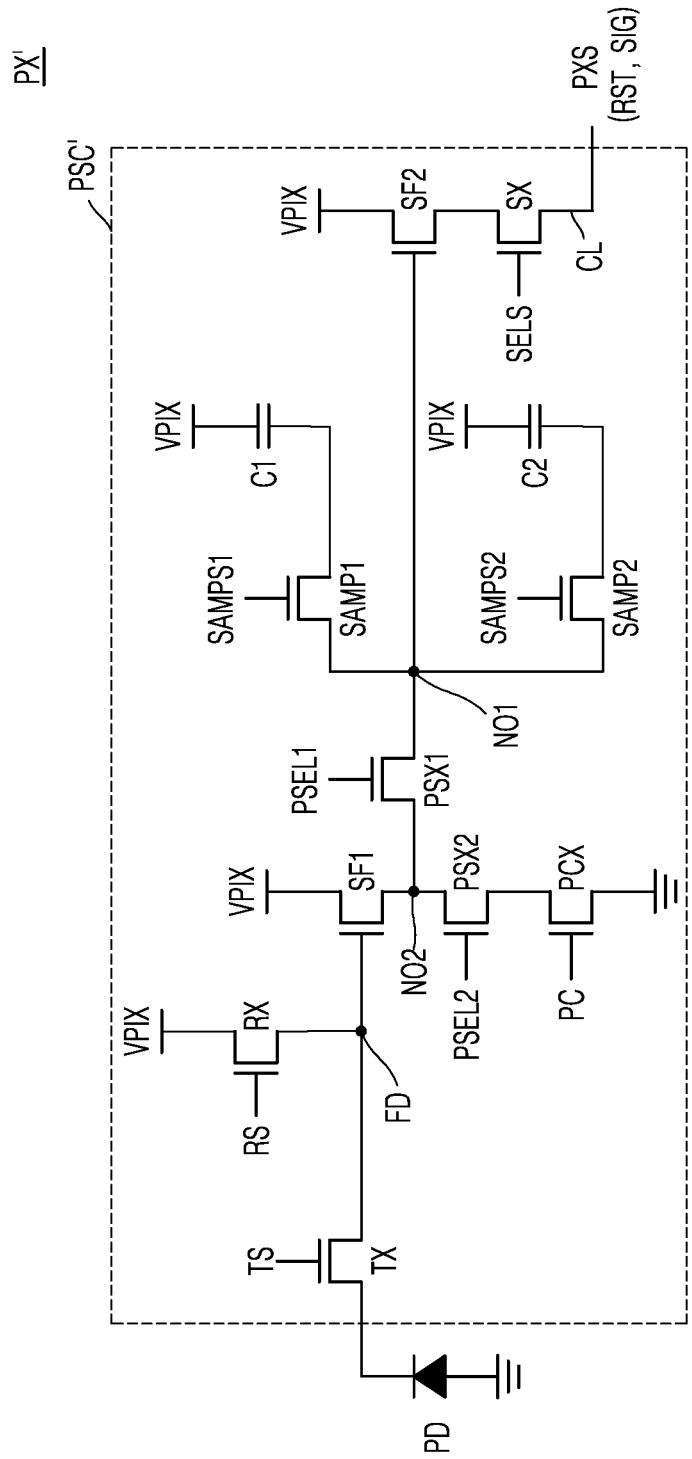

FIGS. 3 and 4 are circuit diagrams of pixels included in an image sensor, according to embodiments.

Referring to FIG. 3, a pixel PX may include a photodiode PD and a pixel signal generation circuit PSC configured to generate a pixel signal PXS. Control signals including a transmission control signal TS, a reset control signal RS, a first precharge select control signal PSEL1, a second precharge select control signal PSEL2, a precharge control signal PC, a first sampling control signal SAMPS1, a second sampling control signal SAMPS2, and a select control signal SELS, that are applied to the pixel signal generation circuit PSC, may be some of the control signals CSs generated by the row driver 140.

The photodiode PD may generate photocharges varying according to a strength of light. For example, the photodiode PD may generate charges, i.e., electrons that are negative charges and holes that are positive charges, in proportion to a strength of incident light. The photodiode PD is an example of a photoelectric conversion element, and may include at least one of a photo transistor, a photo gate, a pinned photo diode (PPD), and a combination thereof.

The pixel signal generation circuit PSC may include a plurality of transistors such as a transmission transistor TX, a reset transistor RX, a first source follower SF1, a precharge transistor PCX, a first precharge select transistor PSX1, a second precharge select transistor PSX2, a first sampling transistor SAMP1, a second sampling transistor SAMP2, a second source follower SF2, and a select transistor SX. The pixel signal generation circuit PSC may further include a first capacitor C1, and a second capacitor C2. In each of the first capacitor C1 and the second capacitor C2, charges according to a reset operation or charges according to a photocharge accumulation operation may be accumulated.

The transmission transistor TX may be connected between the photodiode PD and a floating diffusion node FD. A first terminal of the transmission transistor TX may be connected to an output end of the photodiode PD, and a second terminal of the transmission transistor TX may be connected to the floating diffusion node FD. The transmission transistor TX may be turned on or off in response to the transmission control signal TS received from the row driver 140, and transmit photocharges generated by the photodiode PD to the floating diffusion node FD. The floating diffusion node FD may have a parasitic capacitance.

The reset transistor RX may reset charges accumulated in the floating diffusion node FD. A pixel voltage VPIX may be applied to a first terminal of the reset transistor RX, and a second terminal of the reset transistor RX may be connected to the floating diffusion node FD. The reset transistor RX may be turned on or off in response to the reset control signal RS received from the row driver 140, and charges accumulated in the floating diffusion node FD may be discharged to reset the floating diffusion node FD.

The first source follower SF1 is a buffer amplifier, and may buffer a signal according to a charge amount charged in the floating diffusion node FD. The pixel voltage VPIX may be applied to a first terminal of the first source follower SF1, and a second terminal of the first source follower SF1 may be connected to a second output node NO2. According to the charge amount charged in the floating diffusion node FD, a potential of the floating diffusion node FD may change, and according to the change in the potential of the floating diffusion node FD, the first source follower SF1 may amplify the potential change in the floating diffusion node FD, and output the amplification result to the second output node NO2.

A first terminal of the precharge transistor PCX may be connected to the second output node NO2, and a second terminal of the precharge transistor PCX may be connected to the second precharge select transistor PSX2. The precharge transistor PCX may precharge the second output node NO2 in response to the precharge control signal PC received from the row driver 140.

The first precharge select transistor PSX1 may be connected between the second output node NO2 and a first output node NO1. The first precharge select transistor PSX1 may be turned on or off in response to the first precharge select control signal PSEL1 received from the row driver 140, and reset the first output node NO1. The first output node NO1 may have a parasitic capacitance.

A first terminal of the second precharge select transistor PSX2 may be connected to the precharge transistor PCX, and a ground voltage may be applied to a second terminal of the second precharge select transistor PSX2. The second precharge select transistor PSX2 may be turned on or off in response to the second precharge select control signal PSEL2 received from the row driver 140 and reset the second output node NO2. That is, the first source follower SF1, the precharge transistor PCX, and the second precharge select transistor PSX2 may be connected in series.

The precharge transistor PCX may have a relatively large transistor size to operate as a current source. For example, a gate width or a gate thickness of the precharge transistor PCX may be relatively large. In this case, because a capacitance of the precharge transistor PCX is also large, much power may be consumed to turn the precharge transistor PCX on/off. That is, when the second output node NO2 is reset only with an on/off operation of the precharge transistor PCX, relatively much power may be consumed.

The pixel PX of the image sensor, according to the embodiment, may include the second precharge select transistor PSX2 connected in series to the precharge transistor PCX and having a smaller size than the precharge transistor PCX. For example, a gate width of the second precharge select transistor PSX2 may be smaller than the gate width of the precharge transistor PCX, or a gate thickness of the second precharge select transistor PSX2 may be smaller than the gate thickness of the precharge transistor PCX. Therefore, the precharge transistor PCX may operate as a current source by continuously maintaining an on state, and the second precharge select transistor PSX2 may be controlled to be turned on/off, thereby controlling an operation of resetting the second output node NO2 while consuming relatively little power.

A first terminal of the first sampling transistor SAMP1 may be connected to the first output node NO1, and a second terminal of the first sampling transistor SAMP1 may be connected to the first capacitor C1. The first sampling transistor SAMP1 may be turned on or off in response to the first sampling control signal SAMPS1 received from the row driver 140, and may connect the first capacitor C1 to the first output node NO1.

The pixel voltage VPIX may be applied to a first terminal of the first capacitor C1, and a second terminal of the first capacitor C1 may be connected to the first sampling transistor SAMP1. According to a switching operation of the first sampling transistor SAMP1, charges may be accumulated in the first capacitor C1. For example, charges according to a reset operation of resetting the floating diffusion node FD may be accumulated in the first capacitor C1. However, unlike shown in FIG. 3, in the pixel PX of the image sensor, according to the embodiment, the first capacitor C1 may be connected to the first output node NO1, and the pixel voltage VPIX may be applied to or blocked from the first terminal of the first capacitor C1 according to a switching operation of the first sampling transistor SAMP1.

A first terminal of the second sampling transistor SAMP2 may be connected to the first output node NO1, and a second terminal of the second sampling transistor SAMP2 may be connected to the second capacitor C2. The second sampling transistor SAMP2 may be turned on or off in response to the second sampling control signal SAMPS2 received from the row driver 140 and connect the second capacitor C2 to the first output node NO1.

The pixel voltage VPIX may be applied to a first terminal of the second capacitor C2, and a second terminal of the second capacitor C2 may be connected to the second sampling transistor SAMP2. According to a switching operation of the second sampling transistor SAMP2, charges may be accumulated in the second capacitor C2. For example, charges according to a photocharge accumulation operation of accumulating, in the floating diffusion node FD, photocharges generated by the photodiode PD may be accumulated in the second capacitor C2. However, unlike shown in FIG. 3, in the pixel PX of the image sensor, according to the embodiment, the second capacitor C2 may be connected to the first output node NO1, and the pixel voltage VPIX may be applied to or blocked from the first terminal of the second capacitor C2 according to a switching operation of the second sampling transistor SAMP2.

The pixel voltage VPIX may be applied to a first terminal of the second source follower SF2, and a second terminal of the second source follower SF2 may be connected to the select transistor SX. The second source follower SF2 may amplify a potential change of the first output node NO1, and output the amplification result.

A first terminal of the select transistor SX may be connected to the second source follower SF2, and a second terminal of the select transistor SX may be connected to a column line CL. The column line CL may be one of the first to $n^{th}$ column lines CL0 to CLn−1 of FIG. 1. The select transistor SX may be turned on or off in response to the select control signal SELS received from the row driver 140. When the select transistor SX is turned on, a reset signal RST corresponding to the reset operation or an image signal SIG corresponding to the photocharge accumulation operation may be output to the column line CL.

That is, the second source follower SF2 and the select transistor SX may output, to the column line CL, the pixel signal PXS according to a potential change of the first output node NO1 and output, to the column line CL, the pixel signal PXS corresponding to one of a charge amount stored in the first capacitor C1 and a charge amount stored in the second capacitor C2.

In the pixel PX of the image sensor 100, according to the embodiment, both the first capacitor C1 and the second capacitor C2 may be connected to the first output node NO1 and the second source follower SF2. Therefore, compared to a comparative example in which the first capacitor C1 and the second capacitor C2 are respectively connected to different source followers, the image sensor according to the embodiment may include a reduced number of transistors constituting a pixel. In addition, the pixel PX of the image sensor 100, according to the embodiment, may include the first precharge select transistor PSX1 and the second precharge select transistor PSX2, thereby efficiently resetting the first output node NO1. The image sensor 100 may remove an offset occurring between the reset signal RST according to the reset operation and the image signal SIG according to the photocharge accumulation operation due to charges remaining at the first output node NO1.

Referring to FIG. 4, a pixel PX' may include the photodiode PD and a pixel signal generation circuit PSC' configured to generate the pixel signal PXS. Compared to the pixel signal generation circuit PSC described with reference to FIG. 3, the pixel signal generation circuit PSC' of FIG. 4 may include the second precharge select transistor PSX2, the first terminal of which is connected to the second output node NO2, and the second terminal of which is connected to the precharge transistor PCX, and include the precharge transistor PCX, the first terminal of which is connected to the second precharge select transistor PSX2, and to the second terminal of which a ground voltage is applied.

Figure 5:
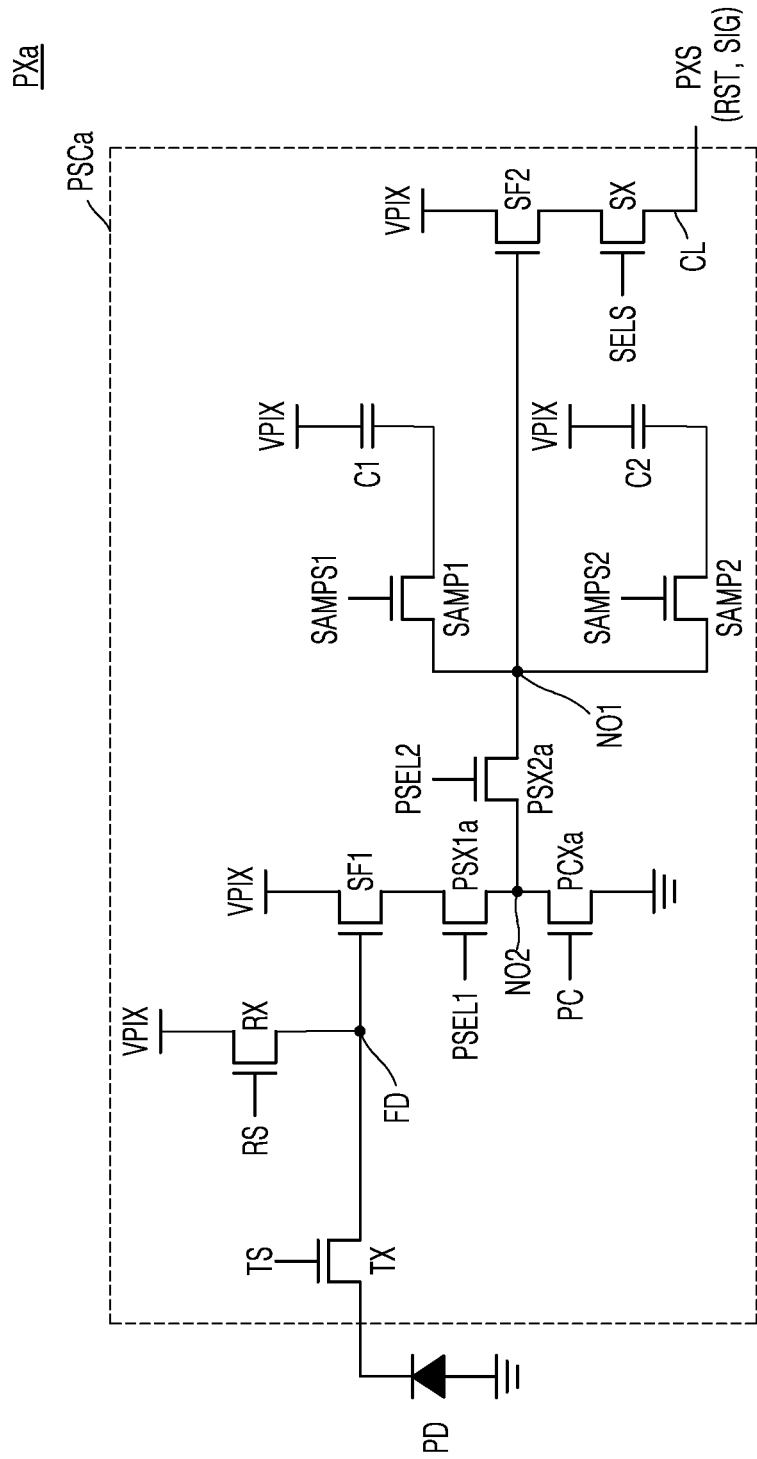

FIG. 5 is a circuit diagram of a pixel included in an image sensor, according to an embodiment. Duplicate descriptions in view of the previous embodiments shown in FIGS. 3 and 4 will not be made again.

Referring to FIG. 5, a pixel PXa may include the photodiode PD and a pixel signal generation circuit PSCa configured to generate the pixel signal PXS. Control signals including the transmission control signal TS, the reset control signal RS, the first precharge select control signal PSEL1, the second precharge select control signal PSEL2, the precharge control signal PC, the first sampling control signal SAMPS1, the second sampling control signal SAMPS2, and the select control signal SELS, that are applied to the pixel signal generation circuit PSCa, may be some of the control signals CSs generated by the row driver 140.

The pixel signal generation circuit PSCa may include a plurality of transistors such as the transmission transistor TX, the reset transistor RX, the first source follower SF1, a first precharge select transistor PSX1a, a second precharge select transistor PSX2a, a precharge transistor PCXa, the first sampling transistor SAMP1, the second sampling transistor SAMP2, the second source follower SF2, and the select transistor SX. The pixel signal generation circuit PSCa may further include the first capacitor C1 and the second capacitor C2. In each of the first capacitor C1 and the second capacitor C2, charges according to a reset operation or charges according to a photocharge accumulation operation may be accumulated.

A first terminal of the first precharge select transistor PSX1a may be connected to the first source follower SF1, and a second terminal of the first precharge select transistor PSX1a may be connected to the second output node NO2. A first terminal of the second precharge select transistor PSX2a may be connected to the second output node NO2, and a second terminal of the second precharge select transistor PSX2a may be connected to the first output node NO1. A first terminal of the precharge transistor PCXa may be connected to the second output node NO2, and a ground voltage may be applied to a second terminal of the precharge transistor PCXa.

Figure 6:
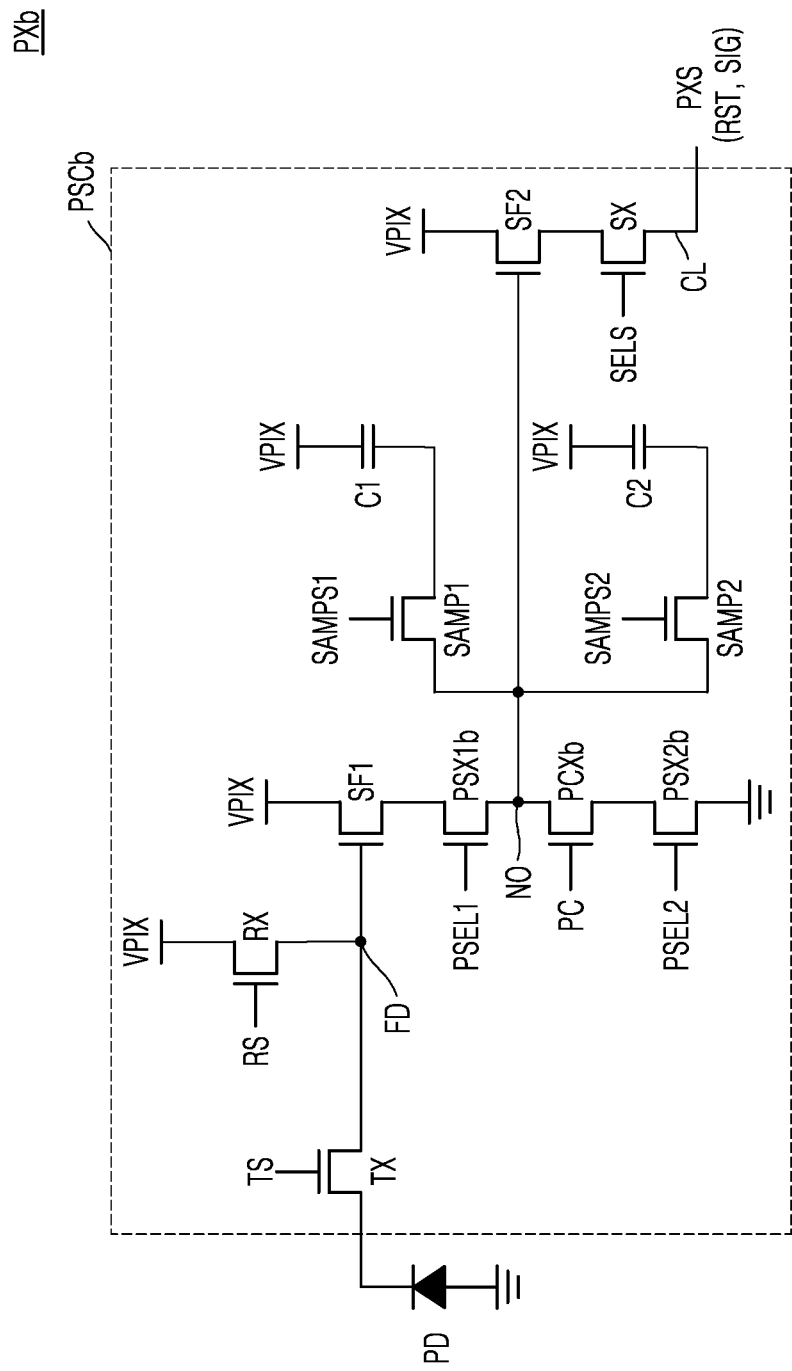
Figure 7:
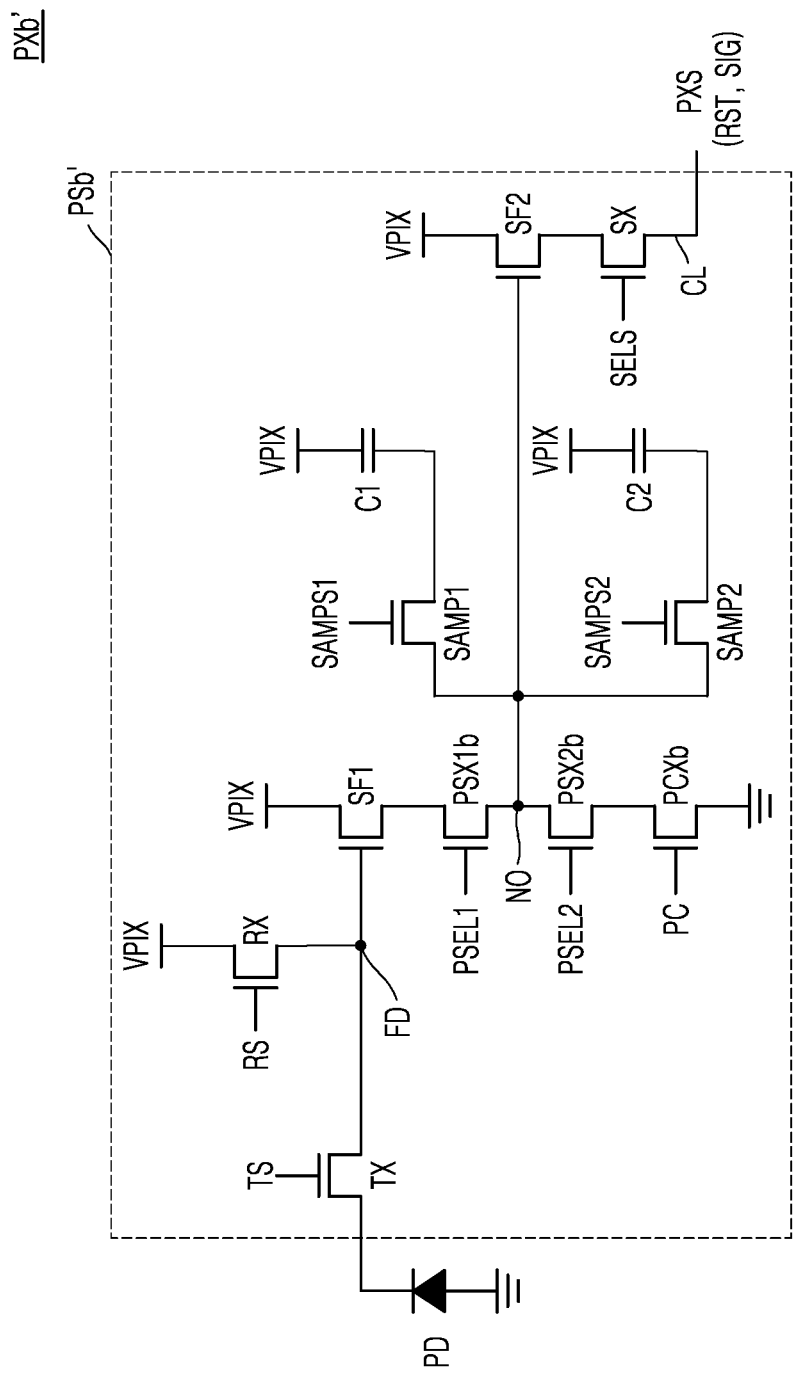

FIGS. 6 and 7 are circuit diagrams of pixels included in an image sensor, according to example embodiments. Duplicate descriptions in view of the previous embodiment shown in FIGS. 3 and 4 will not be made again.

Referring to FIG. 6, a pixel PXb may include the photodiode PD and a pixel signal generation circuit PSCb configured to generate the pixel signal PXS. Control signals including the transmission control signal TS, the reset control signal RS, the first precharge select control signal PSEL1, the second precharge select control signal PSEL2, the precharge control signal PC, the first sampling control signal SAMPS1, the second sampling control signal SAMPS2, and the select control signal SELS, that are applied to the pixel signal generation circuit PSCb, may be some of the control signals CSs generated by the row driver 140.

The pixel signal generation circuit PSCb may include a plurality of transistors such as the transmission transistor TX, the reset transistor RX, the first source follower SF1, a first precharge select transistor PSX1$b$, a second precharge select transistor PSX2$b$, a precharge transistor PCXb, the first sampling transistor SAMP1, the second sampling transistor SAMP2, the second source follower SF2, and the select transistor SX. The pixel signal generation circuit PSCb may further include the first capacitor C1 and the second capacitor C2. In each of the first capacitor C1 and the second capacitor C2, charges according to a reset operation or charges according to a photocharge accumulation operation may be accumulated.

A first terminal of the first precharge select transistor PSX1$b$ may be connected to the first source follower SF1, and a second terminal of the first precharge select transistor PSX1$b$ may be connected to an output node NO. The first precharge select transistor PSX1$b$ may be turned on or off in response to the first precharge select control signal PSEL1 received from the row driver 140 and reset the output node NO. The output node NO may have a parasitic capacitance.

A first terminal of the precharge transistor PCXb may be connected to the output node NO, and a second terminal of the precharge transistor PCXb may be connected to the second precharge select transistor PSX2$b$. The precharge transistor PCXb may operate as a current source in response to the precharge control signal PC received from the row driver 140 and precharge the output node NO.

A first terminal of the second precharge select transistor PSX2$b$ may be connected to the precharge transistor PCXb, and a ground voltage may be applied to a second terminal of the second precharge select transistor PSX2$b$. The second precharge select transistor PSX2$b$ may be turned on or off in response to the second precharge select control signal PSEL2 received from the row driver 140 and precharge the output node NO.

According to an embodiment, the first precharge select transistor PSX1$b$, the precharge transistor PCXb, and the second precharge select transistor PSX2$b$ may be connected in series.

The first terminal of the first sampling transistor SAMP1 may be connected to the output node NO, and the second terminal of the first sampling transistor SAMP1 may be connected to the first capacitor C1. The first sampling transistor SAMP1 may be turned on or off in response to the first sampling control signal SAMPS1 received from the row driver 140, and charges according to the reset operation may be accumulated in the first capacitor C1 according to switching of the first sampling transistor SAMP1.

The first terminal of the second sampling transistor SAMP2 may be connected to the output node NO, and the second terminal of the second sampling transistor SAMP2 may be connected to the second capacitor C2. The second sampling transistor SAMP2 may be turned on or off in response to the second sampling control signal SAMPS2 received from the row driver 140, and charges according to the photocharge accumulation operation may be accumulated in the second capacitor C2 according to switching of the second sampling transistor SAMP2.

In the pixel PXb of the image sensor 100, according to the embodiment, both the first capacitor C1 and the second capacitor C2 may be connected to the output node NO and the second source follower SF2. Therefore, compared to a comparative example in which the first capacitor C1 and the second capacitor C2 are respectively connected to different source followers, the image sensor according to the embodiment may include a reduced number of transistors constituting a pixel. In addition, the pixel PXb of the image sensor 100, according to the embodiment, may include the first precharge select transistor PSX1$b$ and the second precharge select transistor PSX2$b$, thereby efficiently resetting the output node NO. The image sensor 100 may remove an offset occurring between the reset signal RST according to the reset operation and the image signal SIG according to the photocharge accumulation operation due to charges remaining at the output node NO.

Referring to FIG. 7, a pixel PXb' may include the photodiode PD and a pixel signal generation circuit PSCb' configured to generate the pixel signal PXS. Control signals including the transmission control signal TS, the reset control signal RS, the first precharge select control signal PSEL1, the second precharge select control signal PSEL2, the precharge control signal PC, the first sampling control signal SAMPS1, the second sampling control signal SAMPS2, and the select control signal SELS, that are applied to the pixel signal generation circuit, PSCb' may be some of the control signals CSs generated by the row driver 140. The pixel signal generation circuit PSCb' may include a plurality of transistors such as the transmission transistor TX, the reset transistor RX, the first source follower SF1, the first precharge select transistor PSX1$b$, the second precharge select transistor PSX2$b$, the precharge transistor PCXb, the first sampling transistor SAMP1, the second sampling transistor SAMP2, the second source follower SF2, and the select transistor SX. The pixel signal generation circuit PSCb' may further include the first capacitor C1 and the second capacitor C2.

Unlike described with reference to FIG. 6, the pixel signal generation circuit PSCb' of FIG. 7 may include the second precharge select transistor PSX2$b$, the first terminal of which is connected to the output node NO, and the second terminal of which is connected to the precharge transistor PCXb, and include the precharge transistor PCXb, the first terminal of which is connected to the second precharge select transistor PSX2$b$, and to the second terminal of which a ground voltage is applied.

Figure 8:
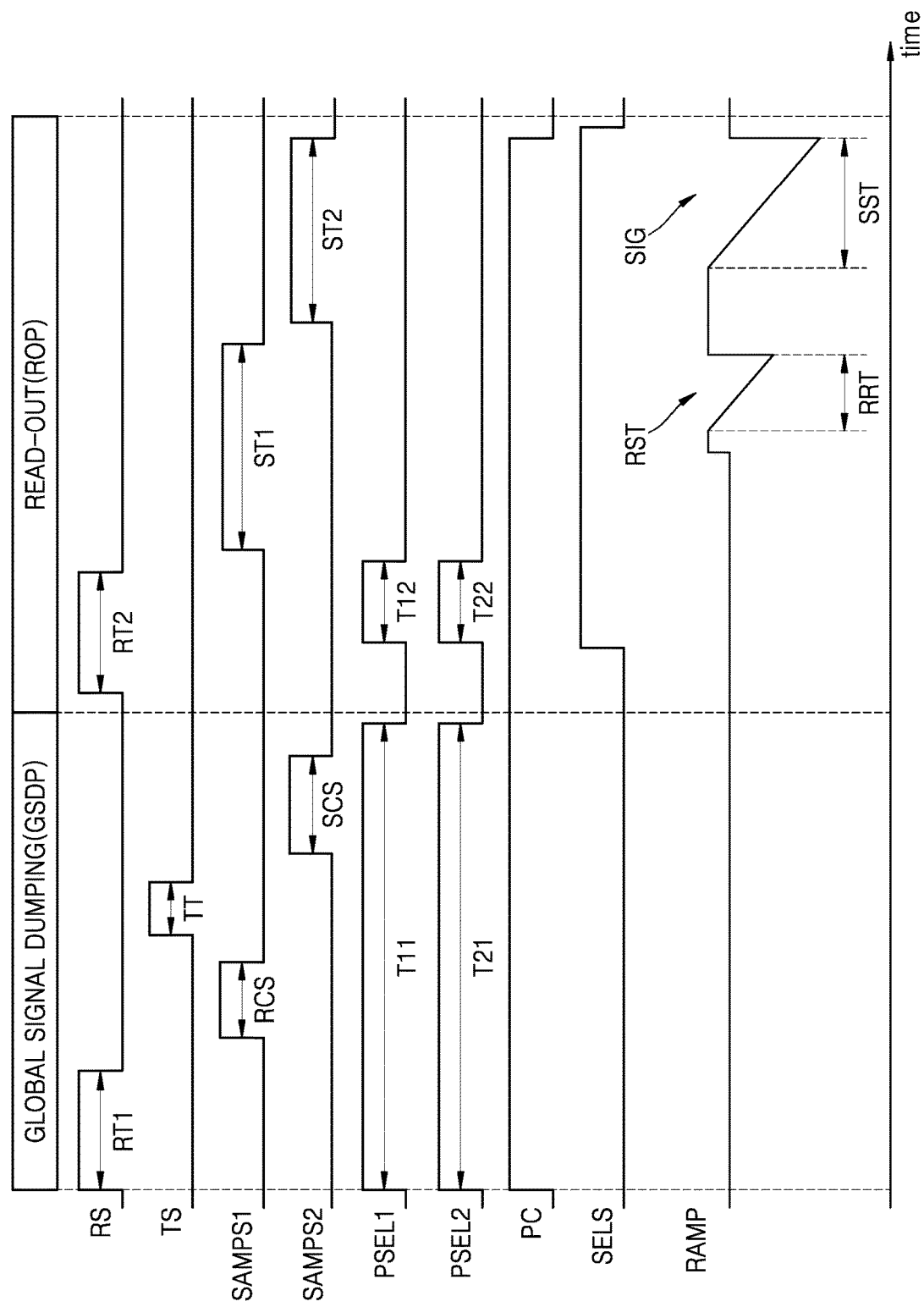
FIGS. 8 to 11 are timing diagrams of control signals and a ramp signal provided to a pixel of an image sensor, according to embodiments.

FIG. 8 is a timing diagram of control signals and a ramp signal provided to a pixel of an image sensor, according to an embodiment. The same control signals may be provided to pixels in the same row. The control signals to be described with reference to FIG. 8 may be provided to the pixels PX, PX', PXa, PXb, and PXb' described with reference to FIGS. 3 to 7, and hereinafter, for convenience of description, a description will be made with reference to FIGS. 3 and 8 to 11.

Referring to FIGS. 3 and 8, operations to be described below may be performed in the global signal dumping period GSDP. The reset control signal RS may transit from a low level (a second level) to a high level (a first level), maintain the first level during a first reset time RT1, and then transit to the low level. According to turn-on of the reset transistor RX in response to the reset control signal RS being the high level, the floating diffusion node FD may be reset (a reset operation). For example, a voltage of the floating diffusion node FD may be reset to the pixel voltage VPIX.

After the reset control signal RS transits from the high level to the low level, the first sampling control signal SAMPS1 may transit from the low level to the high level and maintain the high level during a reset settling time RCS. According to turn-on of the first sampling transistor SAMP1 in response to the first sampling control signal SAMPS1 being the high level, the voltage of the reset floating diffusion node FD may be sampled to the first capacitor C1 connected to the first output node NO1 (or the output node NO of FIGS. 6 and 7).

After the first sampling transistor SAMP1 transits from the high level to the low level, the transmission control signal TS may transit from the low level to the high level, and maintain the high level during an integration time TT. According to turn-on of the transmission transistor TX in response to the transmission control signal TS being the high level, photocharges generated by the photodiode PD may be accumulated in the floating diffusion node FD. For example, the voltage of the floating diffusion node FD may gradually decrease from the pixel voltage VPIX according to an accumulated charge amount.

After the transmission control signal TS transits from the high level to the low level, the second sampling control signal SAMPS2 may transit from the low level to the high level, and maintain the high level during a signal settling time SCS. According to turn-on of the second sampling transistor SAMP2 in response to the second sampling control signal SAMPS2 being the high level, the voltage of the floating diffusion node FD may be sampled to the second capacitor C2 connected to the first output node NO1 (or the output node NO of FIGS. 6 and 7).

The first precharge select control signal PSEL1 and the second precharge select control signal PSEL2 may transit from the low level to the high level before the first sampling control signal SAMPS1 transits from the low level to the high level, and maintain the high level until the second sampling control signal SAMPS2 transits from the high level to the low level. For example, the first precharge select control signal PSEL1 may maintain the high level during a first time T11, and the second precharge select control signal PSEL2 may maintain the high level during a first time T21.

According to an embodiment, the first time T11 of the first precharge select control signal PSEL1 and the first time T21 of the second precharge select control signal PSEL2 may overlap each other. For example, the first time T11 of the first precharge select control signal PSEL1 and the first time T21 of the second precharge select control signal PSEL2 may match each other but are not limited thereto. Because the first precharge select transistor PSX1 and the second precharge select transistor PSX2 maintain the turn-on state, the voltage of the floating diffusion node FD may be sampled to the first capacitor C1 or the second capacitor C2 connected to the first output node NO1 (or the output node NO of FIGS. 6 and 7).

The precharge control signal PC may transit from the low level to the high level before the first sampling control signal SAMPS1 transits from the low level to the high level, and maintain the high level even after the second sampling control signal SAMPS2 transits from the high level to the low level. In response to the precharge control signal PC being the high level, the precharge transistor PCX may be turned on, and the first output node NO1 (or the output node NO of FIGS. 6 and 7) may be precharged.

In the global signal dumping period GSDP, the select control signal SELS may maintain the low level.

In the read-out period ROP, operations to be described below may be performed. In the read-out period ROP, the precharge control signal PC may maintain the high level.

The reset control signal RS may transit from the low level to the high level and then maintain the high level during a second reset time RT2. In addition, the first precharge select control signal PSEL1 and the second precharge select control signal PSEL2 may transit from the low level to the high level, and then, the first precharge select control signal PSEL1 may maintain the high level during a second time T12, and the second precharge select control signal PSEL2 may maintain the high level during a second time T22. Herein, the second reset time RT2, the second time T12 of the first precharge select control signal PSEL1, and the second time T22 of the second precharge select control signal PSEL2 may overlap each other.

According to the reset control signal RS being the high level, the first precharge select control signal PSEL1 being the high level, and the second precharge select control signal PSEL2 being the high level, the first output node NO1 (or the output node NO of FIGS. 6 and 7) may be reset. For example, the first output node NO1 may be reset to the pixel voltage VPIX. Therefore, after the global signal dumping period GSDP ends, charges remaining at the first output node NO1 (or the output node NO of FIGS. 6 and 7) may be removed (an output node reset operation).

According to an embodiment, the transmission control signal TS may maintain the low level during the second reset time RT2. Alternatively, According to an embodiment, the transmission control signal TS in the read-out period ROP may have the high level during an integration time, and the integration time may be included in the second reset time RT2 for which the reset control signal RS has the high level.

When the output node reset operation ends according to transition of the reset control signal RS from the high level to the low level, transition of the first precharge select control signal PSEL1 from the high level to the low level, and transition of the second precharge select control signal PSEL2 from the high level to the low level, the first sampling control signal SAMPS1 may transit from the low level to the high level and maintain the high level during a first settling time ST1. Herein, during the first settling time ST1 in which the first sampling control signal SAMPS1 maintains the high level, the select control signal SELS may have the high level, and the select transistor SX may be turned on to output, through the column line CL, the reset signal RST corresponding to charges according to a reset operation, which are sampled to the first capacitor C1.

After the select transistor SX is turned on, the ramp signal RAMP may be generated to decrease (or increase) with a constant slope during a first time RRT. During the first time RRT in which a voltage level of the ramp signal RAMP constantly changes, a CDS circuit (e.g., 151 of FIG. 1) may compare the ramp signal RAMP to the reset signal RST.

After the first settling time ST1 elapses and the first sampling control signal SAMPS1 transits from the high level to the low level, the second sampling control signal SAMPS2 may transit from the low level to the high level and maintain the high level during a second settling time ST2. Herein, during the second settling time ST2 in which the second sampling control signal SAMPS2 maintains the high level, the select control signal SELS may have the high level, and the select transistor SX may be turned on to output, through the column line CL, the image signal SIG corresponding to charges according to an accumulation operation, which are sampled to the second capacitor C2.

After the select transistor SX is turned on, the ramp signal RAMP may be generated to decrease (or increase) with a constant slope during a second time SST. During the second time SST in which a voltage level of the ramp signal RAMP constantly changes, the CDS circuit 151 may compare the ramp signal RAMP to the image signal SIG.

Although FIG. 8 shows that, in the read-out period ROP, the second sampling control signal SAMPS2 transits from the low level to the high level after the first sampling control signal SAMPS1 transits from the low level to the high level, the image sensor according to the embodiment is not limited thereto. In the read-out period ROP, the first sampling control signal SAMPS1 may transit from the low level to the high level after the second sampling control signal SAMPS2 transits from the low level to the high level, and accordingly, the reset signal RST may be output through the column line CL after the image signal SIG is output through the column line CL.

Figure 9:
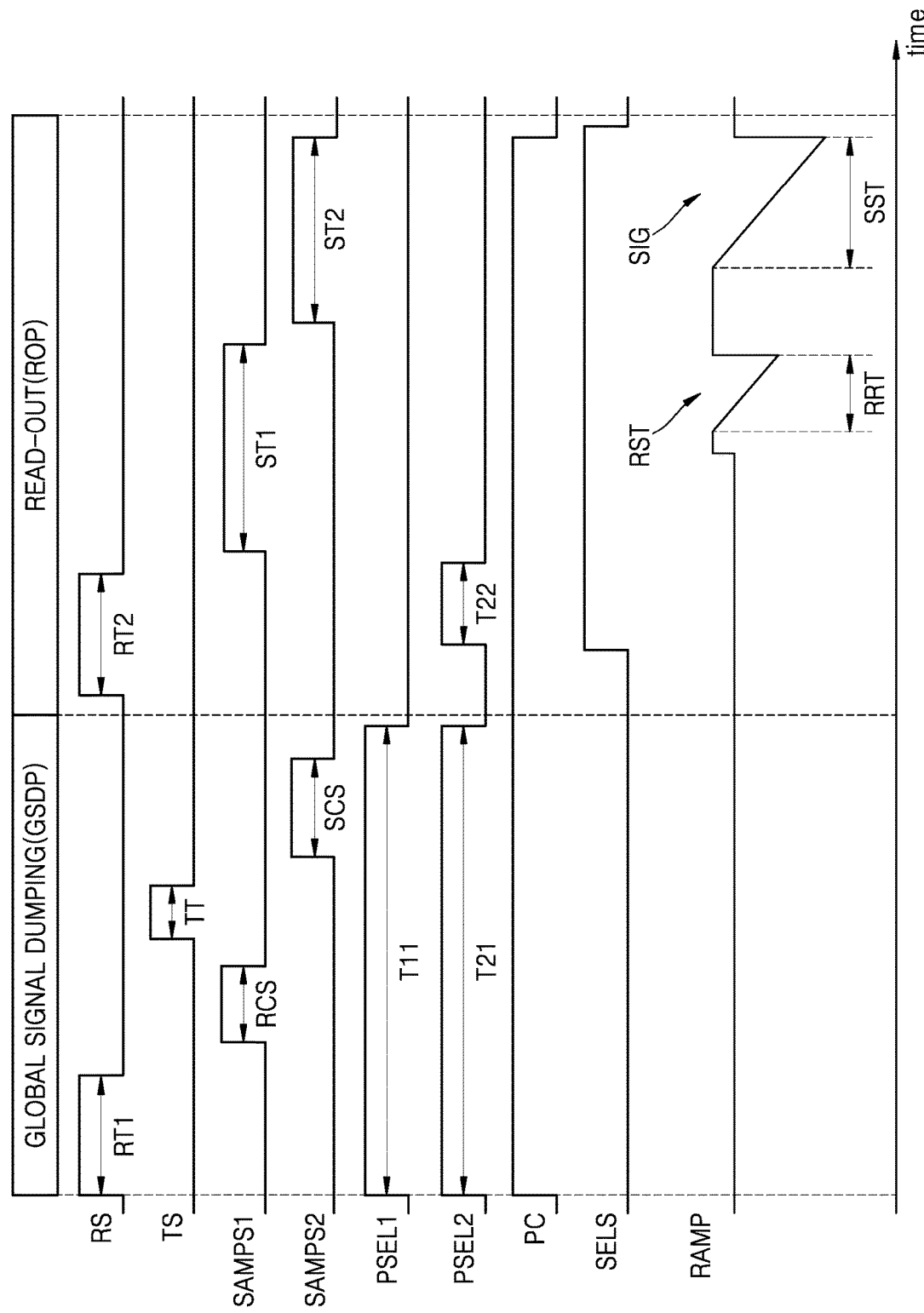

FIG. 9 is a timing diagram of control signals and a ramp signal provided to a pixel of an image sensor, according to an embodiment. The control signals to be described with reference to FIG. 9 may be provided to the pixels PXa. PXb, and PXb' described with reference to FIGS. 5 to 7, and hereinafter, for convenience of description, a description will be made with reference to FIGS. 5 and 9. In a description of FIG. 9, the description made with reference to FIG. 8 will not be repeated.

Referring to FIG. 9 in comparison to FIG. 8, in the read-out period ROP, the reset control signal RS may transit from the low level to the high level and then maintain the high level during the second reset time RT2. In addition, the second precharge select control signal PSEL2 may transit from the low level to the high level and maintain the high level during the second time T22. In FIG. 9, however, the first precharge select control signal PSEL1 may maintain the low level in the read-out period ROP.

According to the reset control signal RS being the high level, the first precharge select control signal PSEL1 being the low level, and the second precharge select control signal PSEL2 being the high level, the first output node NO1 (or the output node NO of FIGS. 6 and 7) may be reset to a ground voltage. Therefore, after the global signal dumping period GSDP ends, charges remaining at the first output node NO1 (or the output node NO of FIGS. 6 and 7) may be removed (an output node reset operation).

Figure 10:
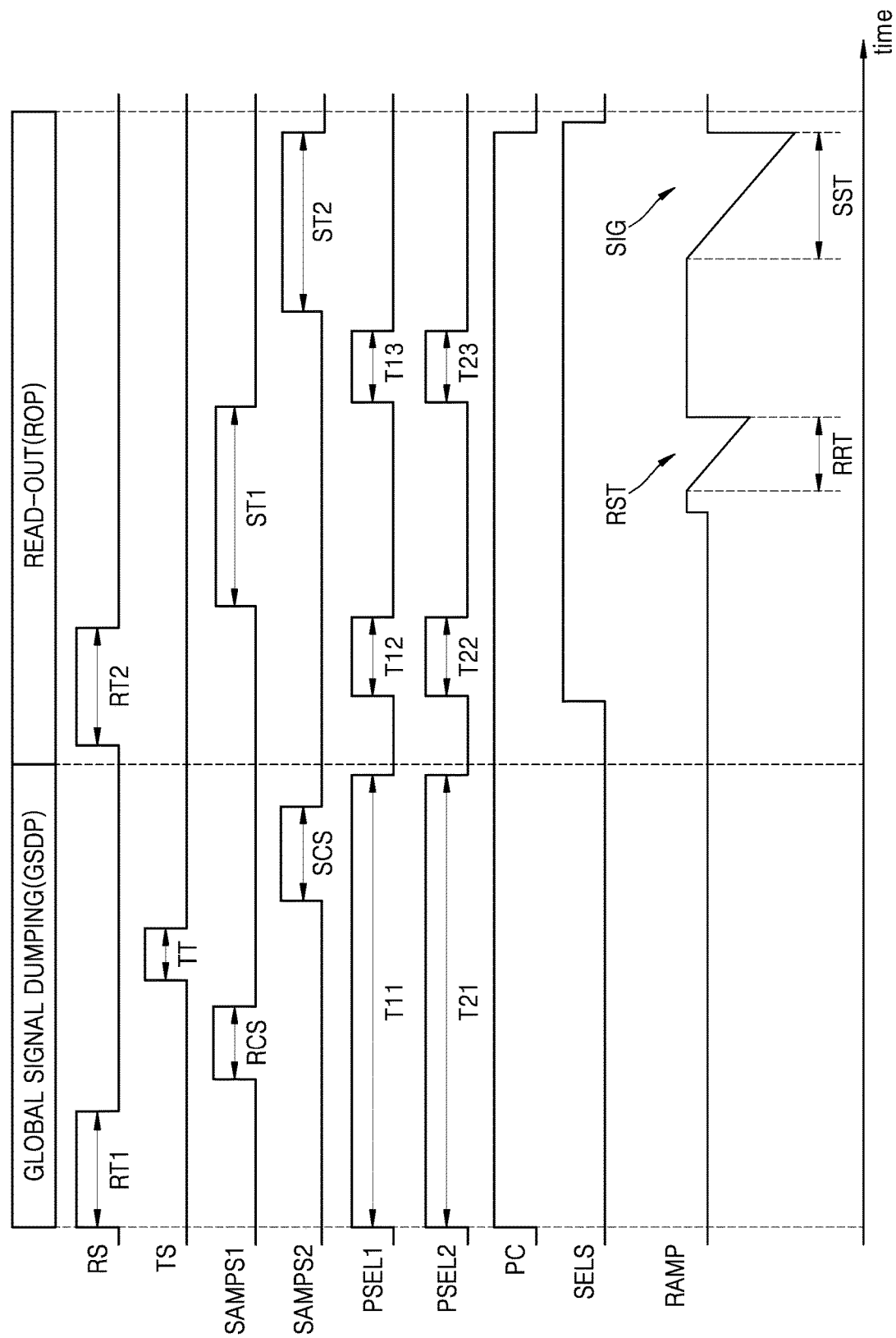

FIG. 10 is a timing diagram of control signals and a ramp signal provided to a pixel of an image sensor, according to an embodiment. The control signals to be described with reference to FIG. 10 may be provided to the pixels PX, PX', PXa, PXb, and PXb' described with reference to FIGS. 3 to 7, and hereinafter, for convenience of description, a description will be made with reference to FIGS. 3 and 8 to 11. In a description of FIG. 10, the description made with reference to FIG. 8 will not be repeated.

Referring to FIGS. 3 and 10, in the read-out period ROP, the first sampling control signal SAMPS1 may transit from the low level to the high level, and the reset signal RST corresponding to charges according to a reset operation, which are sampled to the first capacitor C1, may be output through the column line CL. Thereafter, the first precharge select control signal PSEL1 and the second precharge select control signal PSEL2 may transit from the low level to the high level. For example, the first precharge select control signal PSEL1 may maintain the high level during a third time T13, and the second precharge select control signal PSEL2 may maintain the high level during a third time T23. Herein, the third time T13 of the first precharge select control signal PSEL1 and the third time T23 of the second precharge select control signal PSEL2 may overlap each other.

According to the first precharge select control signal PSEL1 being the high level and the second precharge select control signal PSEL2 being the high level, the first output node NO1 (or the output node NO of FIGS. 6 and 7) may be reset. For example, the first output node NO may be reset to the pixel voltage VPIX. Therefore, after the reset signal RST is output through the column line CL, charges remaining at the first output node NO1 (or the output node NO of FIGS. 6 and 7) may be removed (an output node reset operation).

After the output node reset operation ends and the first precharge select control signal PSEL1 and the second precharge select control signal PSEL2 transit from the high level to the low level, the second sampling control signal SAMPS2 may transit from the low level to the high level and maintain the high level for the second settling time ST2. Herein, during the second settling time ST2, the select control signal SELS may have the high level, and the select transistor SX may be turned on to output, through the column line CL, the image signal SIG corresponding to charges according to an accumulation operation, which are sampled to the second capacitor C2.

Figure 11:
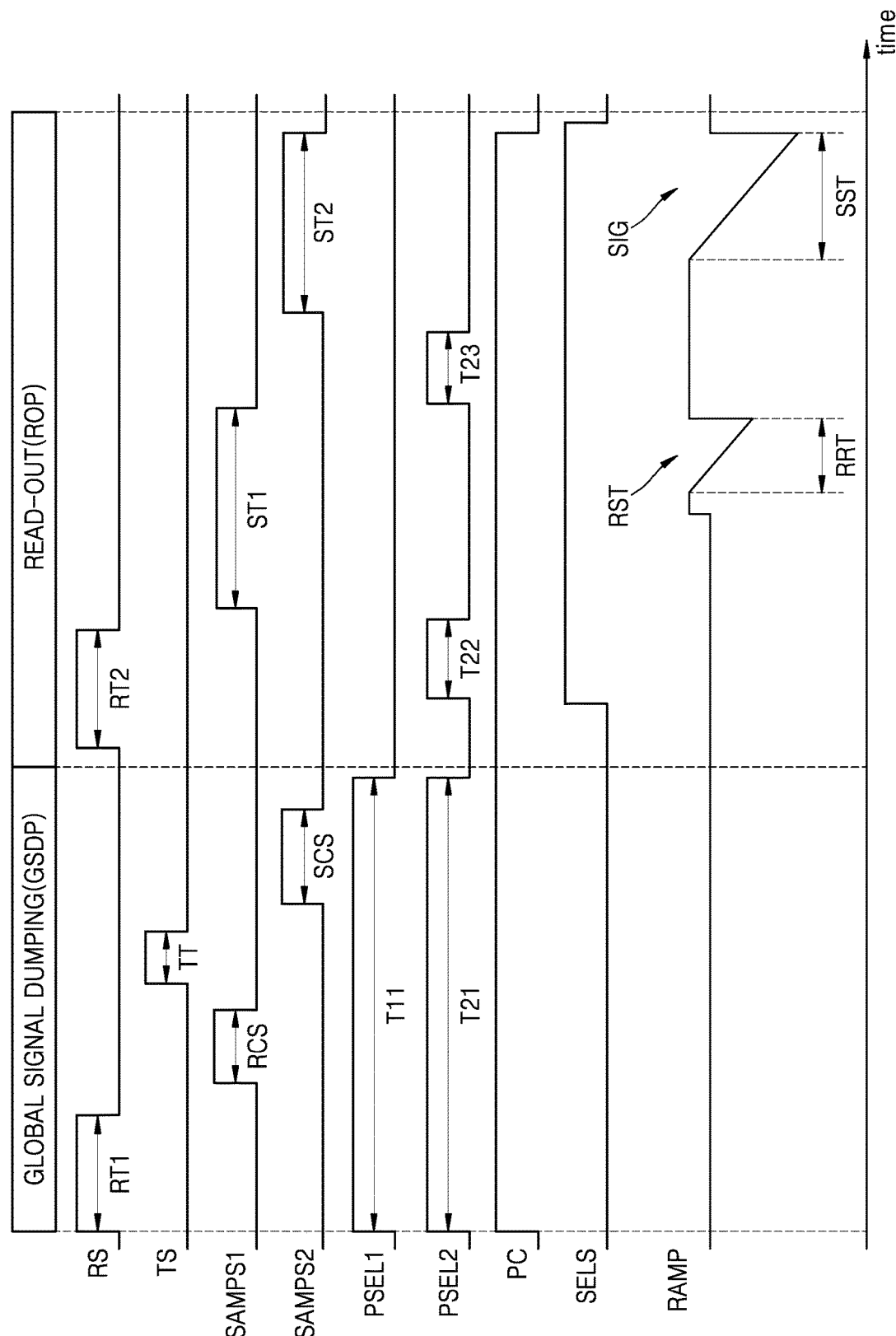

Although FIG. 10 shows that the second sampling control signal SAMPS2 transits from the low level to the high level after the first sampling control signal SAMPS1 transits from the low level to the high level, the image sensor according to the embodiment is not limited thereto. The first sampling control signal SAMPS1 may transit from the low level to the high level after the second sampling control signal SAMPS2 transits from the low level to the high level, and accordingly, the reset signal RST may be output through the column line CL after the image signal SIG is output through the column line CL FIG. 11 is a timing diagram of control signals and a ramp signal provided to a pixel of an image sensor, according to an embodiment. The control signals to be described with reference to FIG. 11 may be provided to the pixels PXa. PXb, and PXb' described with reference to FIGS. 5 to 7, and hereinafter, for convenience of description, a description will be made with reference to FIGS. 5 and 11. In a description of FIG. 11, the description made with reference to FIGS. 8 and 10 will not be repeated.

Referring to FIG. 11 in comparison to FIG. 10, in the read-out period ROP, the second precharge select control signal PSEL2 may transit from the low level to the high level, and then maintain the high level during the third reset time T23. In this case, the first precharge select control signal PSEL1 may maintain the low level.

According to the first precharge select control signal PSEL1 being the low level and the second precharge select control signal PSEL2 being the high level, the first output node NO1 (or the output node NO of FIGS. 6 and 7) may be reset to a ground voltage. Therefore, after the reset signal RST is output through the column line CL, charges remaining at the first output node NO1 (or the output node NO of FIGS. 6 and 7) may be removed (an output node reset operation).

Figure 12:
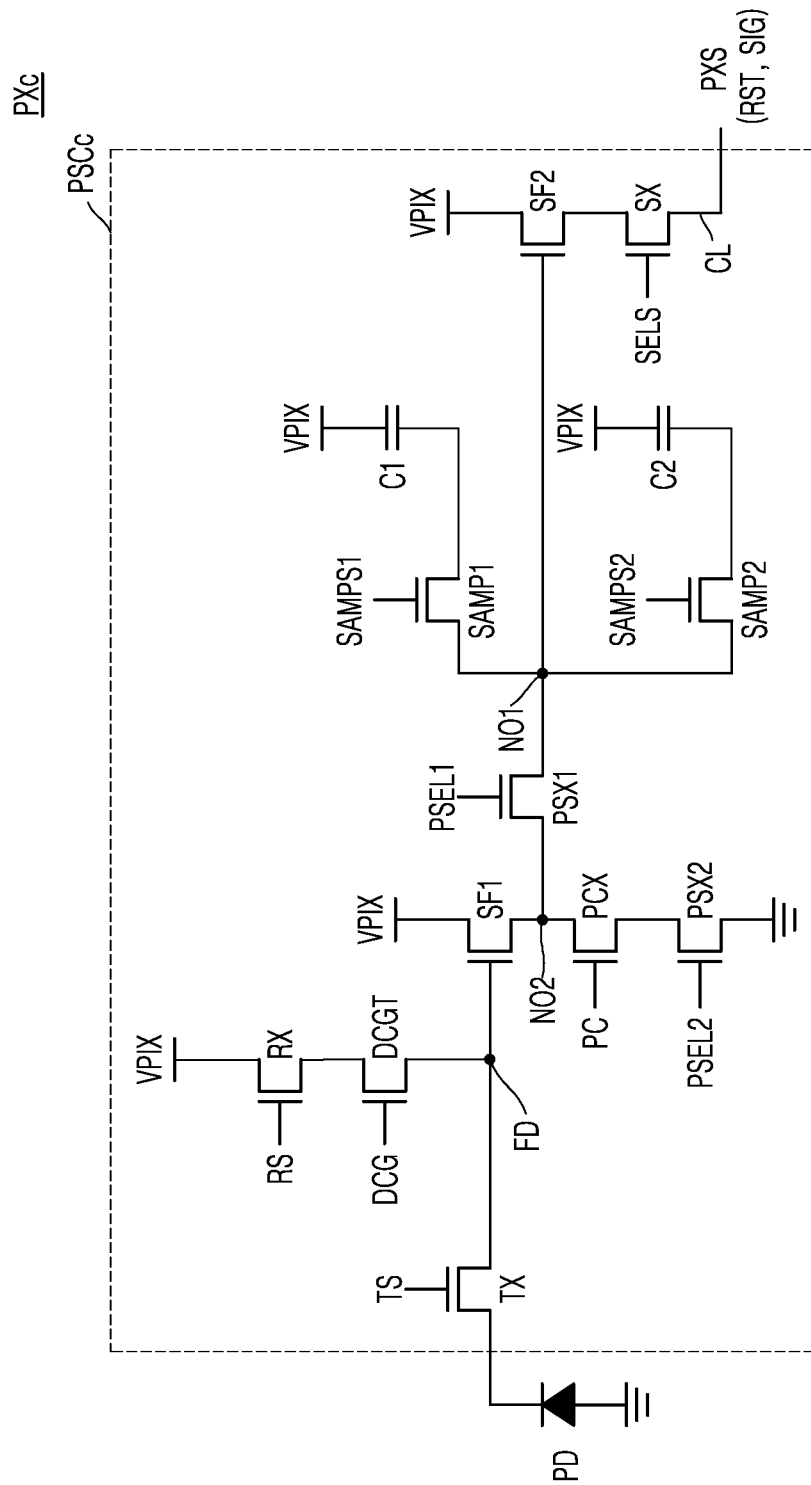
FIG. 12 is a circuit diagram of a pixel included in an image sensor, according to an embodiment.
Figure 13:
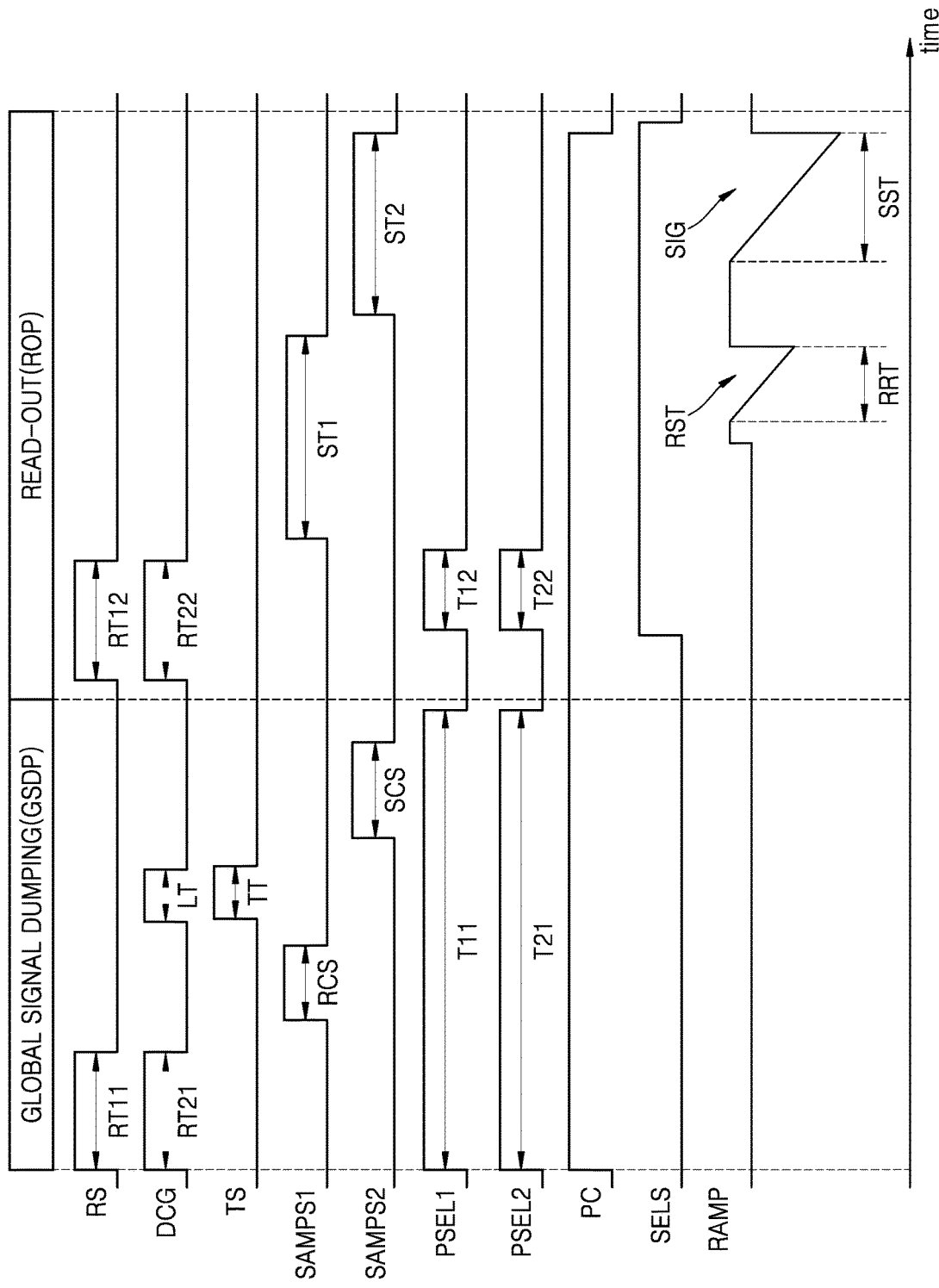
FIG. 13 is a timing diagram of control signals and a ramp signal provided to a pixel of an image sensor, according to an embodiment.

FIG. 12 is a circuit diagram of a pixel PXc included in an image sensor, according to an embodiment. FIG. 13 is a timing diagram of control signals and a ramp signal provided to a pixel of an image sensor, according to an embodiment. In a description of FIG. 12, a description of the same signs as in FIG. 3 will not be made again. In a description of FIG. 13, the description made with reference to FIG. 8 will not be repeated.

Referring to FIG. 12, the pixel PXc may include the photodiode PD and a pixel signal generation circuit PSCc configured to generate the pixel signal PXS. Control signals including the transmission control signal TS, the reset control signal RS, a conversion gain control signal DCG, the first precharge select control signal PSEL1, the second precharge select control signal PSEL2, the precharge control signal PC, the first sampling control signal SAMPS1, the second sampling control signal SAMPS2, and the select control signal SELS, that are applied to the pixel signal generation circuit PSCc, may be some of the control signals CSs generated by the row driver 140.

The pixel signal generation circuit PSCc may include a plurality of transistors such as the transmission transistor TX, the reset transistor RX, a conversion gain transistor DCGT, the first source follower SF1, the first precharge select transistor PSX1, the second precharge select transistor PSX2, the precharge transistor PCX, the first sampling transistor SAMP1, the second sampling transistor SAMP2, the second source follower SF2, and the select transistor SX. The pixel signal generation circuit PSCc may further include the first capacitor C1 and the second capacitor C2.

The pixel signal generation circuit PSCc may include the reset transistor RX and the conversion gain transistor DCGT. The pixel voltage VPIX may be applied to the first terminal of the reset transistor RX, and the second terminal of the reset transistor RX may be connected to the conversion gain transistor DCGT. A first terminal of the conversion gain transistor DCGT may be connected to the reset transistor RX, and a second terminal of the conversion gain transistor DCGT may be connected to the floating diffusion node FD.

The reset transistor RX may be turned on or off in response to the reset control signal RS received from the row driver 140, and the conversion gain transistor DCGT may be turned on or off in response to the conversion gain control signal DCG received from the row driver 140. When the reset transistor RX and the conversion gain transistor DCGT are turned on, charges accumulated in the floating diffusion node FD may be discharged so that the floating diffusion node FD is reset.

Referring to FIGS. 12 and 13, in the global signal dumping period GSDP, the reset control signal RS may transit from the low level to the high level, and maintain the high level during a first reset time RT11. In the global signal dumping period GSDP, the conversion gain control signal DCG may transit from the low level to the high level and maintain the high level during a first reset time RT21. In response to the reset control signal RS and the conversion gain control signal DCG being the high level, the reset transistor RX and the conversion gain transistor DCGT may be turned on so that the floating diffusion node FD is reset (a reset operation). According to an embodiment, the first reset time RT11 of the reset control signal RS and the first reset time RT21 of the conversion gain control signal DCG may overlap each other, e.g., match each other.

According to an embodiment, the image sensor may support a dual conversion gain (DCG) function by operating in a low conversion gain (LCG) mode and a high conversion gain (HCG) mode. In the LCG mode, when the transmission control signal TS maintains the high level during the integration time TT, the conversion gain control signal DCG may have the high level. The conversion gain control signal DCG may maintain the high level during an LCG time LT, and the LCG time LT and the integration time TT may overlap each other.

While accumulating photocharges in the floating diffusion node FD, the conversion gain transistor DCGT is turned on, and thus, there may occur an effect that an equivalent capacitance of the floating diffusion node FD substantially increases, and a conversion gain for converting photocharges generated by the photodiode PD into the image signal SIG may decrease. However, as the equivalent capacitance of the floating diffusion node FD increases, relatively many photocharges may be accumulated in the floating diffusion node FD.

According to an embodiment, an additional capacitor may be further connected to the first terminal of the conversion gain transistor DCGT, and when the conversion gain transistor DCGT is turned on, the additional capacitor may be electrically connected to the floating diffusion node FD so that the equivalent capacitance of the floating diffusion node FD increases.

Although FIG. 13 is a timing diagram for describing a case where the image sensor operates in the LCG mode, the image sensor according to the embodiment is not limited thereto. When the image sensor operates in the HCG mode, the conversion gain control signal DCG may maintain the low level during the integration time TT in which the transmission control signal TS maintains the high level. In the HCG mode, the conversion gain for converting photocharges generated by the photodiode PD into the image signal SIG may relatively increase, and a relatively small amount of photocharges may be accumulated in the floating diffusion node FD.

In the read-out period ROP, when the reset control signal RS maintains the high level during a second reset time RT12, the conversion gain control signal DCG may maintain the high level during a second reset time RT22. According to turn-on of the reset transistor RX in response to the reset control signal RS being the high level and turn-on of the conversion gain transistor DCGT in response to the conversion gain control signal DCG being the high level, the floating diffusion node FD may be reset. For example, the voltage of the floating diffusion node FD may be reset to the pixel voltage VPIX. In addition, the second output node NO2 may be reset The conversion gain transistor DCGT described with reference to FIG. 12 may also be further included in the pixels PX', PXa, PXb, and PXb' described with reference to FIGS. 4 to 7. The description of the conversion gain transistor DCGT of FIG. 12 may also be applied to a conversion gain transistor to be formed in the pixels PX', PXa. PXb, and PXb' described with reference to FIGS. 4 to 7.

Figure 14:
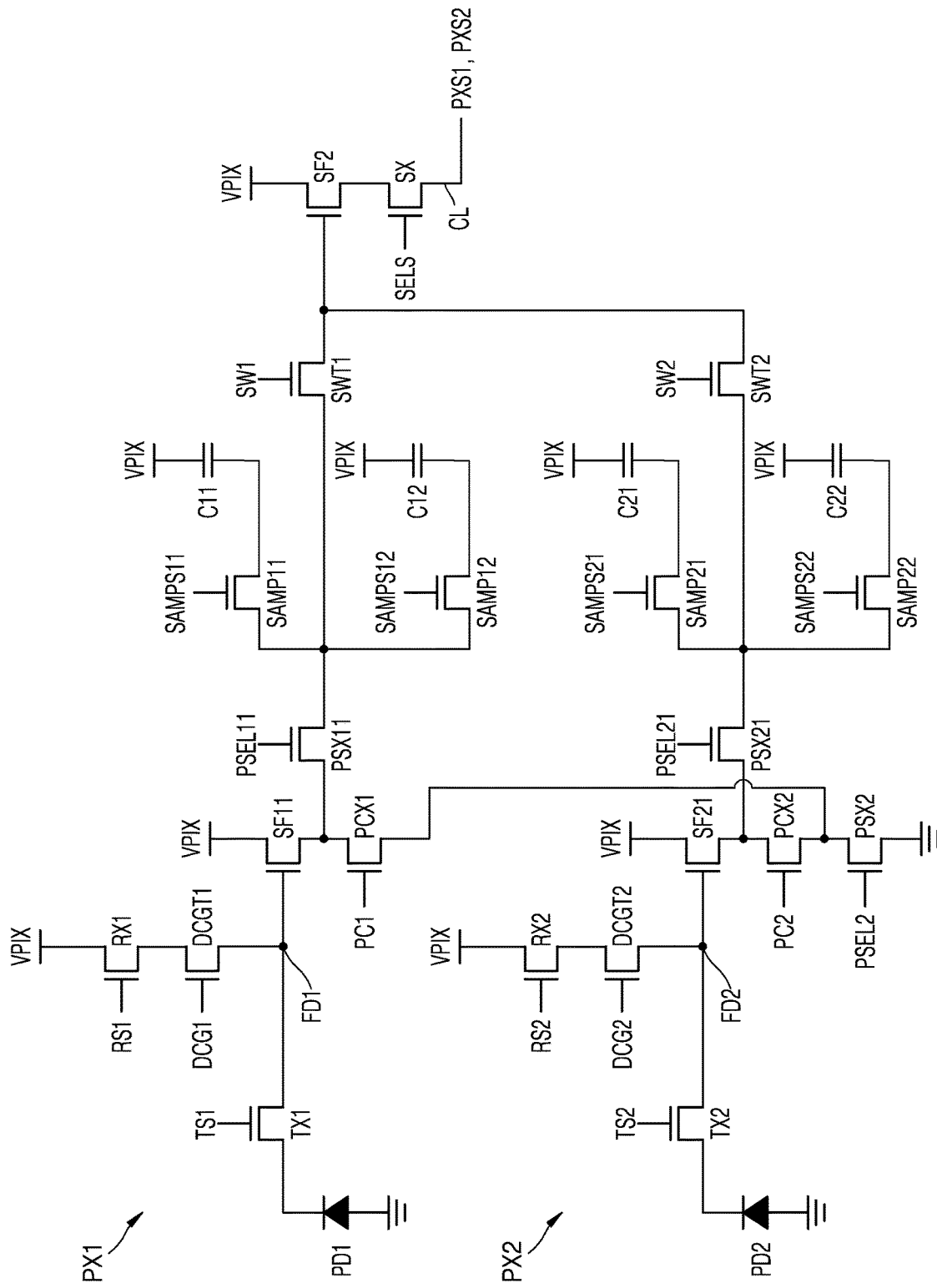
FIG. 14 is a circuit diagram of pixels included in an image sensor, according to an embodiment.

FIG. 14 is a circuit diagram of a first pixel and a second pixel included in an image sensor, according to an embodiment.

Referring to FIG. 14, the pixel army 110 of FIG. 1 may include a first pixel PX1 and a second pixel PX2 connected to a same column line CL. The column line CL may be one of the first to $n^{th}$ column lines CL0 to CLn−1 of FIG. 1. For example, the first pixel PX1 and the second pixel PX2 may be arranged to be adjacent to each other in a column direction but are not limited thereto, and the first pixel PX1 and the second pixel PX2 may be arranged to be adjacent to each other in a row direction. According to an embodiment, the same microlens may be formed on the first pixel PX1 and the second pixel PX2 but is not limited thereto, and respective microlenses may be formed on the first pixel PX1 and the second pixel PX2. The first pixel PX1 and the second pixel PX2 may be auto-focusing (AF) pixels configured to perform an AF function and a distance measurement function. When the first pixel PX1 and the second pixel PX2 do not perform the AF function, the first pixel PX1 and the second pixel PX2 may operate as general pixels and generate the pixel signal PXS for image capturing.

The first pixel PX1 may include a photodiode PD1 and first transistors such as a transmission transistor TX1, a reset transistor RX1, a conversion gain transistor DCGT1, a first source follower SF11, a first precharge select transistor PSX11, the second precharge select transistor PSX2, a precharge transistor PCX1, a first sampling transistor SAMP11, a second sampling transistor SAMP12, a switching transistor SWT1, the second source follower SF2, and the select transistor SX, configured to generate a first pixel signal PXS1. The first pixel PX1 may further include first and second capacitors C11 and C12. Control signals including a transmission control signal TS1, a reset control signal RS1, a conversion gain control signal DCG1, a first precharge select control signal PSEL11, the second precharge select control signal PSEL2, a precharge control signal PC1, a first sampling control signal SAMPS11, a second sampling control signal SAMPS12, and the select control signal SELS, that are applied to the first transistors may be some of the control signals CSs generated by the row driver 140 of FIG. 1.

The second pixel PX2 may include a photodiode PD2 and second transistors such as a transmission transistor TX2, a reset transistor RX2, a conversion gain transistor DCGT2, a first source follower SF21, a first precharge select transistor PSX21, the second precharge select transistor PSX2, a precharge transistor PCX2, a first sampling transistor SAMP21, a second sampling transistor SAM P22, a switching transistor SWT2, the second source follower SF2, and the select transistor SX, configured to generate a second pixel signal PXS2, and first and second capacitors C21 and C22. Control signals including a transmission control signal TS2, a reset control signal RS2, a conversion gain control signal DCG2, a first precharge select control signal PSEL21, the second precharge select control signal PSEL2, a precharge control signal PC2, a first sampling control signal SAMPS21, a second sampling control signal SAM PS22, and the select control signal SELS, that are applied to the second transistors may be some of the control signals CSs generated by the row driver 140 of FIG. 1.

According to an embodiment, the first pixel PX1 and the second pixel PX2 may share at least one of the second precharge select transistor PSX2, the second source follower SF2, and the select transistor SX. However, the image sensor according to the embodiment is not limited thereto, and the first pixel PX1 and the second pixel PX2 may share one or more transistors, such as the first precharge select transistor PSX1, other than the second precharge select transistor PSX2, the second source follower SF2, and the select transistor SX. Because the first pixel PX1 and the second pixel PX2 arranged to be adjacent to each other share some transistors, an area of the pixel array 110 may decrease, and a degree of integration may increase.

Although FIG. 14 shows that the two pixels (the first and second pixels) PX1 and PX2 share the second precharge select transistor PSX2, the second source follower SF2, and the select transistor SX, the image sensor according to the embodiment is not limited thereto. Three or more pixels may share one of the second precharge select transistor PSX2, the second source follower SF2, and the select transistor SX.

The same description of the photodiode PD, the transmission transistor TX, the reset transistor RX, the first source follower SF1, the first precharge select transistor PSX1, the second precharge select transistor PSX2, the precharge transistor PCX, the first sampling transistor SAMP1, the second sampling transistor SAMP2, the second source follower SF2, and the select transistor SX in the pixel PX of FIG. 3 may be applied to the photodiode PD1, the transmission transistor TX1, the reset transistor RX1, the first source follower SF11, the first precharge select transistor PSX11, the second precharge select transistor PSX2, the precharge transistor PCX1, the first sampling transistor SAMP11, the second sampling transistor SAMP12, the second source follower SF2, and the select transistor SX in the first pixel PX1, respectively. The same description of the conversion gain transistor DCGT of FIG. 12 may be applied to the conversion gain transistor DCGT1 in the first pixel PX1. For example, when the transmission transistor TX1 is turned on, photocharges generated by the photodiode PD1 may be transmitted to the floating diffusion node FD1, and when the reset transistor RX1 is turned on, the floating diffusion node FD1 may be reset. Charges according to a reset operation and charges according to a photocharge accumulation operation may be accumulated in the first and second capacitors C11 and C12, respectively.

In addition, the same description of the photodiode PD, the transmission transistor TX, the reset transistor RX, the first source follower SF1, the first precharge select transistor PSX1, the second precharge select transistor PSX2, the precharge transistor PCX, the first sampling transistor SAMP1, the second sampling transistor SAMP2, the second source follower SF2, and the select transistor SX in the pixel PX of FIG. 3 may be applied to the photodiode PD2, the transmission transistor TX2, the reset transistor RX2, the first source follower SF21, the first precharge select transistor PSX21, the second precharge select transistor PSX2, the precharge transistor PCX2, the first sampling transistor SAMP21, the second sampling transistor SAMP22, the second source follower SF2, and the select transistor SX in the second pixel PX2, respectively. The same description of the conversion gain transistor DCGT of FIG. 12 may be applied to the conversion gain transistor DCGT2 in the second pixel PX2. For example, when the transmission transistor TX2 is turned on, photocharges generated by the photodiode PD2 may be transmitted to the floating diffusion node FD2, and when the reset transistor RX2 is turned on, the floating diffusion node FD2 may be reset. Charges according to a reset operation and charges according to a photocharge accumulation operation may be accumulated in the first and second capacitors C21 and C22, respectively.

The floating diffusion node FD1 in the first pixel PX1 may be electrically isolated from the floating diffusion node FD2 in the second pixel PX2.

When the switching transistor SWT1 in the first pixel PX1 is turned on, and the switching transistor SWT2 in the second pixel PX2 is turned off, the first pixel signal PXS1 may be output through the column line CL. On the contrary, when the switching transistor SWT2 in the second pixel PX2 is turned on, and the switching transistor SWT1 in the first pixel PX1 is turned off, the second pixel signal PXS2 may be output through the column line CL. The first pixel signal PXS1 may include a reset signal corresponding to the reset operation and an image signal corresponding to the operation of accumulating the photocharges generated by the photodiode PD1. The second pixel signal PXS2 may include a reset signal corresponding to the reset operation and an image signal corresponding to the operation of accumulating the photocharges generated by the photodiode PD2.

Figure 15A:
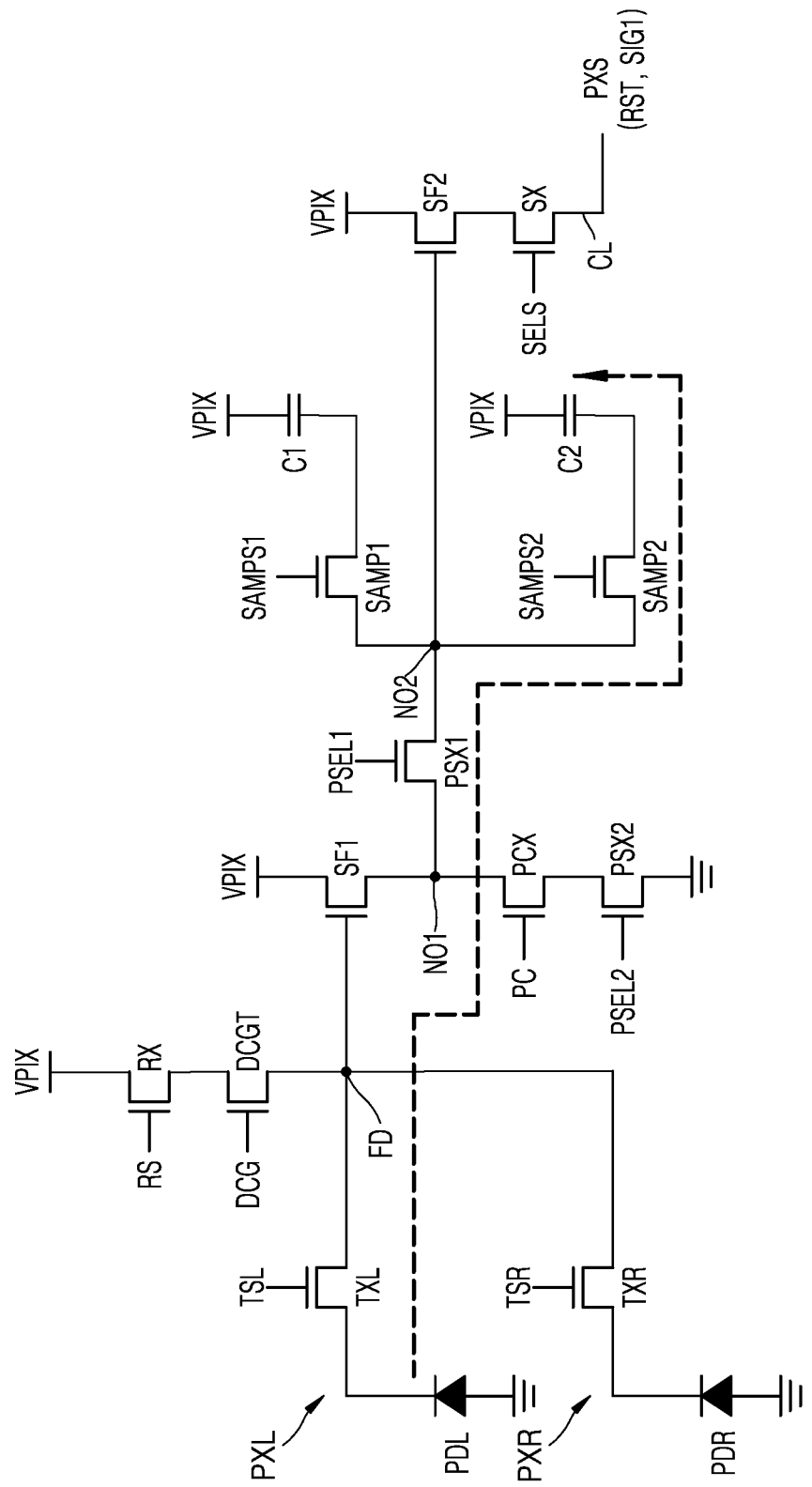
FIGS. 15A and 15B are circuit diagrams of pixels included in an image sensor, according to embodiments.
Figure 15B:
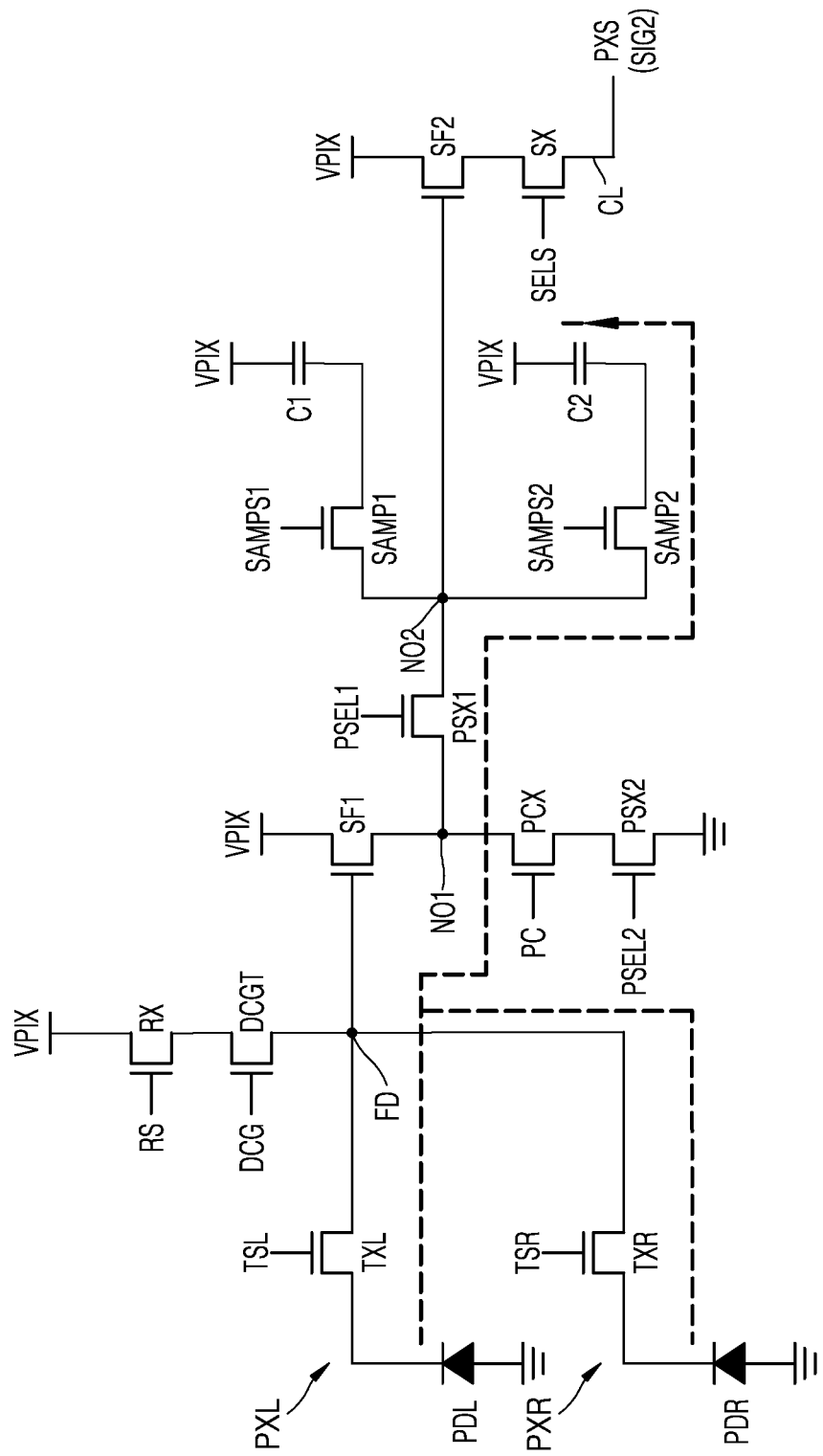

FIGS. 15A and 15B are circuit diagrams of a first pixel and a second pixel included in an image sensor, according to embodiments. In a description of FIGS. 15A and 15B, duplicate descriptions in view of the previous embodiments shown in FIGS. 3 and 12 will not be made again.

Referring to FIGS. 15A and 15B, the pixel array 110 of FIG. 1 may include a first pixel PXL and a second pixel PXR connected to the same column line CL. The column line CL may be one of the first to $n^{th}$ column lines CL0 to CLn−1 of FIG. 1. For example, the first pixel PXL and the second pixel PXR may be arranged to be adjacent to each other in the column or row direction. According to an embodiment, the first pixel PXL and the second pixel PXR may have the same microlens formed thereon and operate as AF pixels. When the first pixel PXL and the second pixel PXR do not operate as the AF function, the first pixel PXL and the second pixel PXR may operate as general pixels for performing an image capturing function.

The first pixel PXL may include a photodiode PDL and a transmission transistor TXL configured to transmit photocharges generated by the photodiode PDL to the floating diffusion node FD. The second pixel PXR may include a photodiode PDR and a transmission transistor TXR configured to transmit photocharges generated by the photodiode PDR to the floating diffusion node FD. A transmission control signal TSL to be provided to the transmission transistor TXL in the first pixel PXL and a transmission control signal TSR to be provided to the transmission transistor TXR in the second pixel PXR may be some of the control signals CSs generated by the row driver 140 of FIG. 1.

According to an embodiment, the first pixel PXL and the second pixel PXR may share the floating diffusion node FD, a plurality of transistors such as the reset transistor RX, the conversion gain transistor DCGT, the first source follower SF1, the first precharge select transistor PSX1, the second precharge select transistor PSX2, the precharge transistor PCX, the first sampling transistor SAMP1, the second sampling transistor SAMP2, the second source follower SF2, and the select transistor SX, and a plurality of capacitors such as the first and second capacitors C1 and C2. According to an embodiment, the first pixel PXL and the second pixel PXR may share only part of the reset transistor RX, the conversion gain transistor DCGT, the first source follower SF1, the first precharge select transistor PSX1, the second precharge select transistor PSX2, the precharge transistor PCX, the first sampling transistor SAMP1, the second sampling transistor SAMP2, the second source follower SF2, and the select transistor SX. In addition, according to an embodiment, the first pixel PXL and the second pixel PXR may share the first capacitor C1 in which charges according to a reset operation are accumulated or the second capacitor C2 in which charges according to a photocharge accumulation operation are accumulated Connection relationships among the reset transistor RX, the conversion gain transistor DCGT, the first source follower SF1, the first precharge select transistor PSX1, the second precharge select transistor PSX2, the precharge transistor PCX, the first sampling transistor SAMP1, the second sampling transistor SAMP2, the second source follower SF2, the select transistor SX, and the first and second capacitors C1 and C2 shared by the first pixel PXL and the second pixel PXR are the same as the connection relationships among the transistors and the capacitors in the pixel PXc shown in FIG. 12, but the image sensor according to the embodiment is not limited thereto, and the connection relationships among the transistors and the capacitors in the first pixel PXL and the second pixel PXR may be the same as the connection relationships among the transistors and the capacitors in the pixel PX, PX', PXa, PXb, or PXb' described with reference to FIGS. 3 to 7.

Referring to FIG. 15A, charges according to a reset operation of resetting the floating diffusion node FD may be accumulated in the first capacitor C1, and charges according to a first accumulation operation of accumulating, in the floating diffusion node FD, photocharges generated by the photodiode PDL in the first pixel PXL may be accumulated in the second capacitor C2. For example, the transmission transistor TXL in the first pixel PXL may be turned on, and the transmission transistor TXR in the second pixel PXR may be turned off. When the select transistor SX is turned on, and the first sampling transistor SAMP1 is turned on, the reset signal RST corresponding to the reset operation may be output to the column line CL. Alternatively, when the select transistor SX is turned on, and the second sampling transistor SAMP2 is turned on, a first image signal SIG1 corresponding to the first accumulation operation may be output to the column line CL.

Referring to FIGS. 15A and 15B, after the first accumulation operation of accumulating, in the floating diffusion node FD, photocharges generated by the photodiode PDL in the first pixel PXL, a second accumulation operation of accumulating, in the floating diffusion node FD, photocharges generated by the photodiode PDR in the second pixel PXR may be performed. For example, both the transmission transistor TXL in the first pixel PXL and the transmission transistor TXR in the second pixel PXR may be turned on.

After the first image signal SIG1 is output, charges according to the first accumulation operation and the second accumulation operation may be accumulated in the second capacitor C2. When the select transistor SX is turned on, and the second sampling transistor SAMP2 is turned on, a second image signal SIG2 corresponding to the first accumulation operation and the second accumulation operation may be output to the column line CL.

The image sensor according to the embodiment may compare a photocharge amount generated by the first photodiode PDL in the first pixel PX L and a photocharge amount generated by the second photodiode PDR in the second pixel PXR, and perform the AF operation, by using the reset signal RST, the first image signal SIG1, and the second image signal SIG2 obtained by sequentially performing the reset operation, the first accumulation operation, and the second accumulation operation. Alternatively, the image sensor according to the an embodiment may perform the image capturing function by using the reset signal RST and the second image signal SIG2 obtained by performing both the first accumulation operation and the second accumulation operation after the reset operation.

Figure 16:
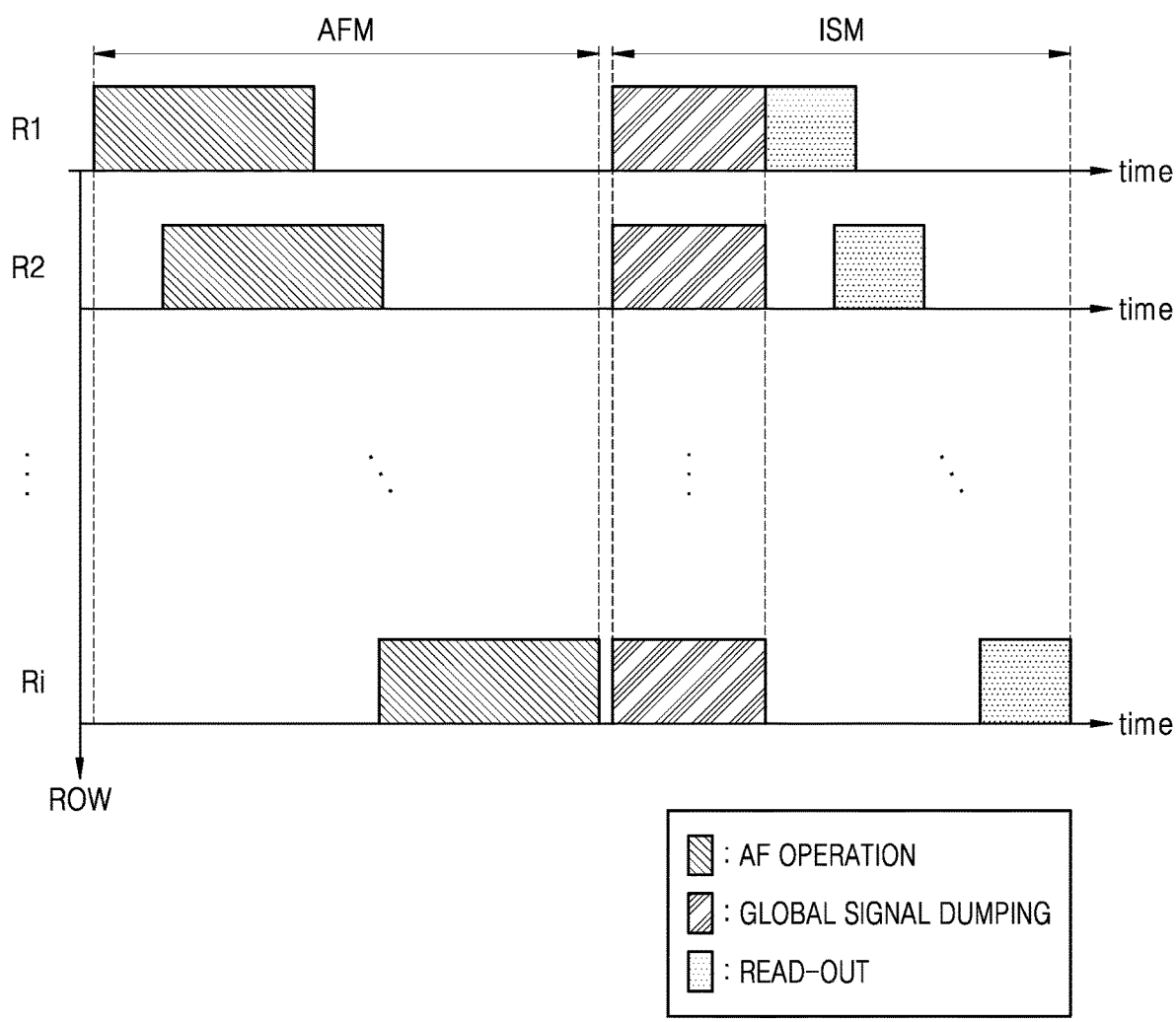
FIG. 16 illustrates operations of an image sensor in the global shutter mode and a rolling shutter mode, according to an embodiment.

FIG. 16 illustrates operations of an image sensor in a global shutter mode and a rolling shutter mode, according to an embodiment.

Referring to FIGS. 1 and 16, the image sensor 100 may operate in the rolling shutter mode and the global shutter mode. According to an embodiment, the image sensor 100 may operate in the rolling shutter mode in an AF operation period AFM for obtaining AF information and operate in the global shutter mode in an image capturing operation period ISM for obtaining image information. However, the operation of the image sensor 100 shown in FIG. 16 is one example and is not limited thereto, and as shown in FIG. 2, the image sensor 100 may operate in the global shutter mode to perform both the AF operation and the image capturing operation.

In the AF operation period AFM, the image sensor 100 may operate such that the AF operation is sequentially performed for each row. For example, the AF operation may be sequentially performed for the first to $i^{th}$ rows R1 to Ri, and a reset time and a photodiode integration time may be differently controlled for the first to $i^{th}$ rows R1 to Ri.

In the image capturing operation period ISM, the image sensor 100 may operate such that a global signal dumping operation is simultaneously performed on the first to $i^{th}$ rows R1 to Ri. For example, the image sensor 100 may operate such that the same global signal dumping period is applied to the first to $i^{th}$ rows R1 to Ri, and the image sensor 100 may operate such that the same reset time and integration time are applied to the first to $i^{th}$ rows R1 to Ri.

In the image capturing operation period ISM, the image sensor 100 may operate such that a read-out operation is sequentially performed for each of the first to $i^{th}$ rows R1 to Ri. For example, the read-out operation may be sequentially performed on the first to $i^{th}$ rows R1 to Ri, and a read-out time may be differently controlled for each of the first to $i^{th}$ rows R1 to Ri.

Figure 17:
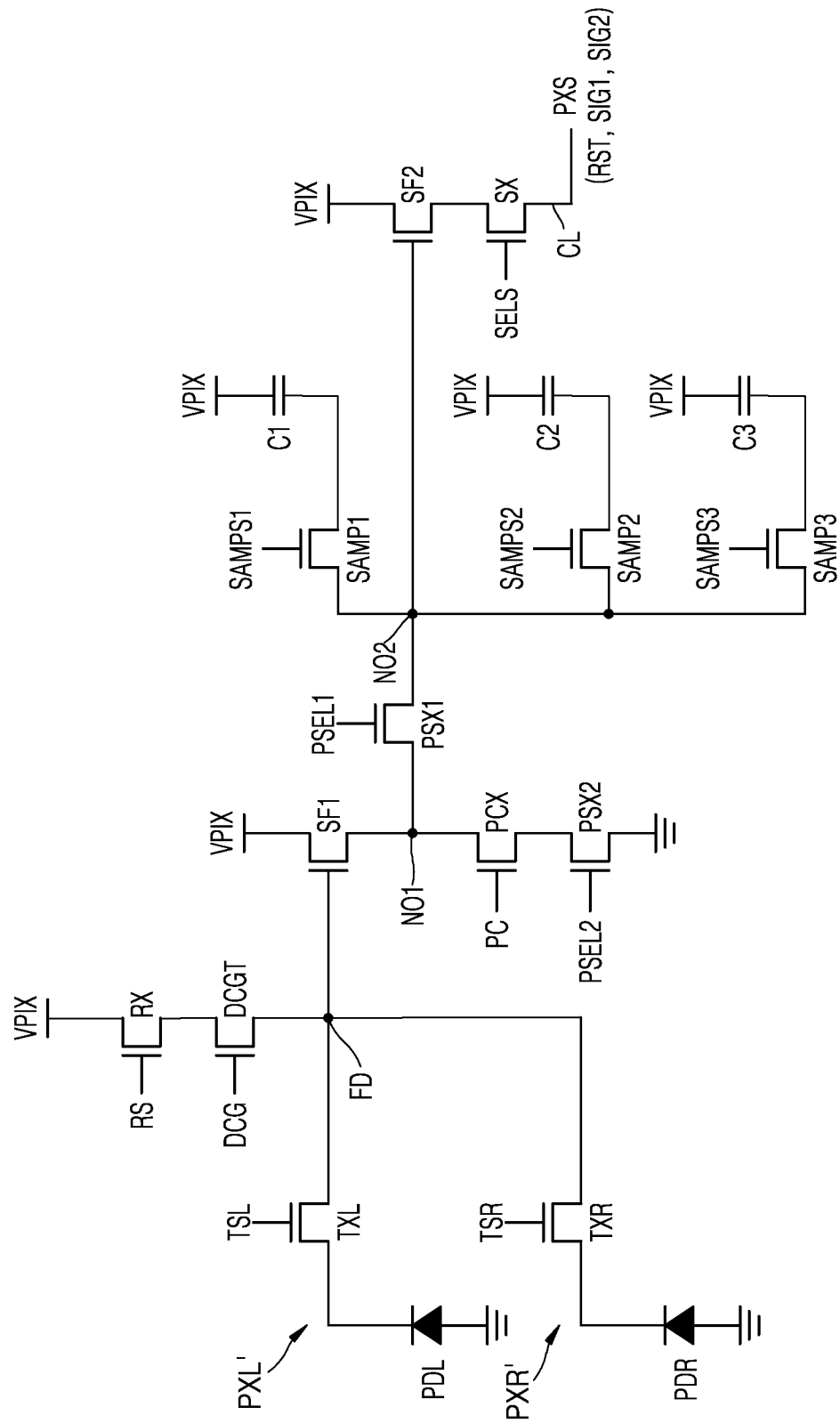
FIG. 17 is a circuit diagram of pixels included in an image sensor, according to an embodiment.

FIG. 17 is a circuit diagram of a first pixel and a second pixel included in an image sensor, according to an embodiment. In a description of FIG. 17, duplicate descriptions in view of the previous embodiments shown in FIGS. 3 and 15B will not be made again.

Referring to FIG. 17, the pixel array 110 of FIG. 1 may include a first pixel PXL' and a second pixel PXR' connected to the same column line CL. For example, the first pixel PXL' and the second pixel PXR' may be arranged to be adjacent to each other in the column or row direction. According to an embodiment, the first pixel PXL' and the second pixel PXR' may have the same microlens formed thereon and operate as AF pixels. When the first pixel PXL' and the second pixel PXR' do not operate as the AF function, the first pixel PXL and the second pixel PXR may operate as general pixels for performing an image capturing function.

The first pixel PXL' may include the photodiode PDL and the transmission transistor TXL configured to transmit photocharges generated by the photodiode PDL to the floating diffusion node FD. The second pixel PXR' may include the photodiode PDR and the transmission transistor TXR configured to transmit photocharges generated by the photodiode PDR to the floating diffusion node FD.

According to an embodiment, the first pixel PXL' and the second pixel PXR' may share the floating diffusion node FD, a plurality of transistors such as the reset transistor RX, the conversion gain transistor DCGT, the first source follower SF1, the first precharge select transistor PSX1, the second precharge select transistor PSX2, the precharge transistor PCX, the first sampling transistor SAMP1, the second sampling transistor SAMP2, a third sampling transistor SAMP3, the second source follower SF2, and the select transistor SX, and a plurality of capacitors such as the first capacitor C1, the second capacitor C2, and a third capacitor C3. According to an embodiment, the first pixel PXL' and the second pixel PXR' may share only part of the above transistors and only part of the above capacitors. The first pixel PXL' and the second pixel PXR' may share the third sampling transistor SAMP3, a first terminal of which is connected to the first output node NO1, and a second terminal of which is connected to the third capacitor C3, and share the third capacitor C3, to a first terminal of which the pixel voltage VPIX is applied, and a second terminal of which is connected to the third sampling transistor SAMP3.

Charges according to a reset operation of resetting the floating diffusion node FD may be accumulated in the first capacitor C1. Charges according to a first accumulation operation of accumulating, in the floating diffusion node FD, photocharges generated by the photodiode PDL in the first pixel PXL' may be accumulated in the second capacitor C2. Charges according to the first accumulation operation and a second accumulation operation of accumulating, in the floating diffusion node FD, photocharges generated by the photodiode PDR in the second pixel PXR' may be accumulated in the third capacitor C3.

After the first accumulation operation and the second accumulation operation end, when the select transistor SX is turned on, and the first sampling transistor SAMP1 is turned on, the reset signal RST corresponding to the reset operation may be output to the column line CL. When the select transistor SX is turned on, and the second sampling transistor SAMP2 is turned on, the first image signal SIG1 corresponding to the first accumulation operation may be output to the column line CL. When the select transistor SX is turned on, and the third sampling transistor SAMP3 is turned on, the second image signal SIG2 corresponding to the first accumulation operation and the second accumulation operation may be output to the column line CL. However, the image sensor according to an embodiment is not limited thereto, and only charges according to the second accumulation operation may be accumulated in the third capacitor C3, and an image signal corresponding to the second accumulation operation may be output.

The image sensor according to the embodiment may compare a photocharge amount generated by the first photodiode PDL in the first pixel PXL' and a photocharge amount generated by the second photodiode PDR in the second pixel PXR' and perform the AF operation, by using the reset signal RST, the first image signal SIG1, and the second image signal SIG2 obtained by sequentially performing the reset operation, the first accumulation operation, and the second accumulation operation. Alternatively, the image sensor according to an embodiment may perform the image capturing function by using the reset signal RST and the second image signal SIG2 obtained by performing both the first accumulation operation and the second accumulation operation after the reset operation.

While the inventive concept has been particularly shown and described with reference to embodiments thereof, it will be understood that various changes in form and details may be made therein without departing from the spirit and scope of the following claims.

What is claimed is:

1. An image sensor comprising a plurality of pixels arranged in a plurality of rows and a plurality of columns, each of the plurality of pixels comprising:
   a photodiode;
   a floating diffusion node configured to accumulate photocharges generated by the photodiode;
   a first capacitor configured to store charges according to a voltage of the floating diffusion node which is reset;
   a second capacitor configured to store charges according to a voltage of the floating diffusion node in which the photocharges are accumulated;
   a first sampling transistor connected to a first output node and configured to sample charges to the first capacitor;
   a second sampling transistor connected to the first output node and configured to sample charges to the second capacitor; and at least one precharge select transistor connected to the first output node and configured to reset the first output node.

2. The image sensor of claim 1, wherein each of the pixels further comprises:
a first source follower configured to amplify the voltage of the floating diffusion node and output the amplified voltage; and
a precharge transistor configured to precharge a second output node connected to one end of the first source follower,
wherein the precharge select transistor comprises:
a first precharge select transistor connected between the first output node and the second output node; and
a second precharge select transistor connected to the precharge transistor, wherein a ground voltage is applied to one end of the second precharge select transistor.

3. The image sensor of claim 1, wherein each of the pixels further comprises:
a first source follower configured to amplify the voltage of the floating diffusion node and output the amplified voltage; and
a precharge transistor configured to precharge a second output node connected to one end of the first source follower,
wherein the precharge select transistor comprises:
a first precharge select transistor connected between the first output node and the second output node; and
a second precharge select transistor connected between the first source follower and the precharge transistor.

4. The image sensor of claim 1, wherein the precharge select transistor is further configured to reset the first output node after charges according to a voltage of the floating diffusion node, which is reset, are stored in the first capacitor, and charges according to a voltage of the floating diffusion node, in which the photocharges are accumulated, are stored in the second capacitor.

5. The image sensor of claim 1, wherein each of the pixels further comprises a second source follower configured to output, to a column line, a pixel signal according to a potential change of the first output node, and
wherein the precharge select transistor is further configured to reset the first output node after a pixel signal corresponding to one of a charge amount stored in the first capacitor and a charge amount stored in the second capacitor is output through the column line.

6. The image sensor of claim 1, wherein the pixels comprise a first pixel and a second pixel, and the first pixel and the second pixel share the precharge select transistor.

7. The image sensor of claim 6, wherein the floating diffusion node in the first pixel is electrically isolated from the floating diffusion node in the second pixel.

8. The image sensor of claim 1, wherein the pixels comprise a first pixel and a second pixel, and the first pixel and the second pixel share the floating diffusion node, the first and second capacitors.

9. The image sensor of claim 8, wherein the first pixel and the second pixel share a third capacitor storing charges according to a voltage of the floating diffusion node in which photocharges generated by the photodiode in the first pixel and photocharges generated by the photodiode in the second pixel are accumulated.

10. An image sensor comprising a pixel array in which a plurality of pixels are arranged, each of the pixels comprising:
a photodiode;
a floating diffusion node configured to accumulate photocharges generated by the photodiode;
a first source follower configured to amplify a voltage of the floating diffusion node and output the amplified voltage;
at least one precharge select transistor connected in series to the first source follower;
a precharge transistor connected in series to the first source follower and configured to precharge a first output node;
a first capacitor configured to store charges according to a voltage of the floating diffusion node which is reset;
a second capacitor configured to store charges according to a voltage of the floating diffusion node in which the photocharges are accumulated;
a first sampling transistor configured to sample charges to the first capacitor;
a second sampling transistor configured to sample charges to the second capacitor; and
a second source follower configured to output, to a column line, a pixel signal according to a potential change of the first output node connected to the first sampling transistor and the second sampling transistor.

11. The image sensor of claim 10, wherein the pixels comprise a first pixel and a second pixel,
wherein the floating diffusion node in the first pixel is electrically isolated from the floating diffusion node in the second pixel, and
wherein the first pixel and the second pixel share the precharge select transistor.

12. The image sensor of claim 10, wherein the pixels comprise a first pixel and a second pixel, and
wherein the first pixel and the second pixel share the floating diffusion node, the first and second capacitors.

13. The image sensor of claim 12, wherein the first pixel and the second pixel share a third capacitor storing charges according to a voltage of the floating diffusion node in which photocharges generated by the photodiode in the first pixel and photocharges generated by the photodiode in the second pixel are accumulated.

14. An image sensor including a first pixel and a second pixel, each of the first pixel and the second pixel comprising:
a photodiode;
a floating diffusion node configured to accumulate photocharges generated by the photodiode;
a first source follower configured to amplify a voltage of the floating diffusion node and output the amplified voltage;
a precharge transistor configured to precharge an output node;
first and second precharge select transistors configured to reset the output node;
a first capacitor connected to the output node and configured to store charges according to a voltage of the floating diffusion node which is reset;
a second capacitor connected to the output node and configured to store charges according to a voltage of the floating diffusion node in which the photocharges are accumulated; and
a second source follower configured to output, to a column line, a pixel signal according to a potential change of the output node,
wherein the first pixel and the second pixel share the second precharge select transistor and the second source follower.

15. The image sensor of claim 14, wherein the precharge transistor is connected between the first source follower and the second precharge select transistor.

16. The image sensor of claim 14, wherein the floating diffusion node in the first pixel is electrically isolated from the floating diffusion node in the second pixel.

17. The image sensor of claim 14, wherein each of the first pixel and the second pixel further comprises a switching transistor connected to the second source follower.

18. The image sensor of claim 14, wherein the first pixel and the second pixel share the floating diffusion node and the first and second capacitors.

19. The image sensor of claim 18, wherein the second capacitor is further configured to store charges corresponding to photocharges generated by the photodiode in the first pixel and then store charges corresponding to photocharges generated by the photodiode in the second pixel.

20. The image sensor of claim 14, wherein each of the first pixel and the second pixel further comprises a third capacitor connected to the output node.

\* \* \* \* \*